US012499813B2

(12) United States Patent
Kim et al.

(10) Patent No.: US 12,499,813 B2
(45) Date of Patent: Dec. 16, 2025

(54) DISPLAY DEVICE, METHOD OF DRIVING THE SAME, AND ELECTRONIC DEVICE INCLUDING THE DISPLAY DEVICE

(71) Applicant: SAMSUNG DISPLAY CO., LTD., Yongin-si (KR)

(72) Inventors: Soo Kyung Kim, Yongin-si (KR); Hae Goo Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/910,742

(22) Filed: Oct. 9, 2024

(65) Prior Publication Data

US 2025/0299619 A1 Sep. 25, 2025

(30) Foreign Application Priority Data

Mar. 19, 2024 (KR) ........................ 10-2024-0037566

(51) Int. Cl.

| | |
|---|---|
| ***G09G 3/20*** | (2006.01) |
| ***G09G 3/00*** | (2006.01) |
| ***G09G 3/3225*** | (2016.01) |
| ***H10K 59/131*** | (2023.01) |

(52) U.S. Cl.

CPC .......... *G09G 3/2096* (2013.01); *G09G 3/006* (2013.01); *G09G 3/3225* (2013.01); *H10K 59/131* (2023.02); *G09G 2300/0842* (2013.01); *G09G 2310/0243* (2013.01); *G09G 2320/04* (2013.01)

(58) Field of Classification Search

CPC .... G09G 3/2096; G09G 3/006; G09G 3/3225; H10K 59/131

See application file for complete search history.

(56) References Cited

U.S. PATENT DOCUMENTS

| | | | |
|---|---|---|---|
| 11,250,775 | B2 | 2/2022 | Lee et al. |
| 2010/0157191 | A1 | 6/2010 | Jeoung et al. |
| 2020/0242999 | A1 | 7/2020 | Oh |

FOREIGN PATENT DOCUMENTS

| | | | |
|---|---|---|---|
| KR | 10-0561549 | B1 | 3/2006 |
| KR | 10-2477977 | B1 | 12/2022 |

*Primary Examiner* — Sardis F Azongha

(74) *Attorney, Agent, or Firm* — F. CHAU & ASSOCIATES, LLC

(57) ABSTRACT

A display device includes a display panel including signal lines connected to at least one pixel, at least one first output pad that transfers a first driving signal supplied to the signal lines, at least one second output pad that transfers a second driving signal supplied to the signal lines, detection pads that sense each of the first driving signal and the second driving signal, an individual pad disposed adjacent to the first output pad and the second output pad, and a driving circuit that generates an individual signal by analyzing a waveform of each of the first driving signal and the second driving signal.

20 Claims, 20 Drawing Sheets

FIG. 15

<EMBODIMENT>

| SCS1 | OS | SCS2 |
|---|---|---|
| HF | OSH | HF |
| HF | OSG | LF |
| LF | OSG | HF |
| LF | OSL | LF |

DISPLAY DEVICE, METHOD OF DRIVING THE SAME, AND ELECTRONIC DEVICE INCLUDING THE DISPLAY DEVICE

TECHNICAL FIELD

This application claims priority under 35 U.S.C. § 119 to Korean Patent Application No. 10-2024-0037566 filed on Mar. 19, 2024 in the Korean Intellectual Property Office, the disclosure of which is incorporated by reference herein in its entirety.

TECHNICAL FIELD

Embodiments of the present disclosure relate to a display device, a method of driving the same, and an electronic device including the display device.

DISCUSSION OF RELATED ART

A display device may include a display panel which outputs an image and a driving circuit which provides signals for driving the display panel. The driving circuit may be electrically connected to the display panel through one or more pads so as to provide a plurality of signals to the display panel.

SUMMARY

Embodiments of the preset disclosure provide a display device and an electronic device, which may prevent or reduce a corrosion phenomenon occurring in pads included in a driving circuit, which may improve the reliability of driving of the display device.

According to an embodiment of the present disclosure, a display device includes a display panel including a plurality of signal lines connected to at least one pixel, at least one first output pad configured to transfer a first driving signal supplied to the signal lines, at least one second output pad configured to transfer a second driving signal supplied to the signal lines, a plurality of detection pads configured to sense each of the first driving signal and the second driving signal, an individual pad disposed adjacent to the at least one first output pad and the at least one second output pad, and a driving circuit configured to generate an individual signal by analyzing a waveform of each of the first driving signal and the second driving signal.

In an embodiment, the driving circuit supplies the individual signal to the individual pad for each of a plurality of predetermined cycles.

In an embodiment, the driving circuit includes a calculating circuit configured to analyze a first waveform of the first driving signal and a second waveform of the second driving signal, and a generating circuit configured to output an individual signal, based on each of the first waveform and the second waveform.

In an embodiment, the individual signal has a data value of an average value of a data value of the first driving signal and a data value of the second driving signal.

In an embodiment, any one of the first driving signal and the second driving signal has a data value of a high level during a first period. The individual signal is generated to have a data value of the high level during a second period smaller than the first period.

In an embodiment, the second period is a half of the first period.

In an embodiment, a waveform of the individual signal has a form in which any one of the first waveform and the second waveform is shifted by a predetermined time interval.

In an embodiment, a waveform of the individual signal has a waveform having a form in which any one of the first waveform and the second waveform is reversed.

In an embodiment, the at least one first output pad includes a (1_1)th output pad and a (1_2)th output pad, which are sequentially arranged in a first direction. The at least one second output pad includes a (2_1)th output pad and a (2_2)th output pad, which are sequentially arranged in the first direction. The individual pad is disposed between the (1_1)th output pad and the (2_1)th output pad.

In an embodiment, the detection pads include a first sub-detection pad and a second sub-detection pad, which are disposed between the (1_2)th output pad and the (2_2)th output pad. The first sub-detection pad is configured to sense the first driving signal, and the second sub-detection pad is configured to sense the second driving signal.

In an embodiment, the at least one first output pad further includes a (1_3)th output pad spaced apart from the (1_2)th output pad in the first direction, and the at least one second output pad further includes a (2_3)th output pad spaced apart from the (2_2)th output pad in the first direction.

In an embodiment, the detection pads include a first detection pad disposed adjacent to the (1_2)th output pad or the (1_3)th output pad in a second direction intersecting the first direction, and a second detection pad disposed adjacent to the (2_2)th output pad or the (2_3)th output pad in an opposite direction of the second direction. The first detection pad is configured to sense the first driving signal, and the second detection pad is configured to sense the second driving signal.

In an embodiment, the driving circuit is disposed in a chip-on pad manner on the display panel.

In an embodiment, each predetermined driving cycle is one frame.

According to an embodiment of the present disclosure, a display device includes a display panel including a plurality of signal lines connected to at least one pixel, at least one first output pad configured to transfer a first driving signal supplied to the signal lines, at least one second output pad configured to transfer a second driving signal supplied to the signal lines, a plurality of detection pads configured to sense each of the first driving signal and the second driving signal, an individual pad disposed adjacent to the at least one first output pad and the at least one second output pad, and a driving circuit configured to generate an individual signal, based on a frequency of each of the first driving signal and the second driving signal. The driving circuit is configured to supply the individual signal to the individual pad for each of a plurality of predetermined cycles.

According to an embodiment of the present disclosure, a method of driving a display device includes applying a first driving signal to a first output pad electrically connected to a display panel, applying a second driving signal to a second output pad different from the first output pad, which is electrically connected to the display panel, sensing each of the first driving signal and the second driving signal, generating an individual signal, based on a waveform of each of the sensed first driving signal and the sensed second driving signal, and supplying the individual signal to an individual pad disposed adjacent to the first output pad and the second output pad for each of a plurality of predetermined driving cycles.

In an embodiment, generating the individual signal includes analyzing, by a calculating circuit, each of a first waveform of the first driving signal and a second waveform of the second driving signal, and outputting, by a generating circuit, the individual signal, based on each of the first waveform and the second waveform.

In an embodiment, when generating the individual signal, the generating circuit outputs the individual signal having a data value of an average value of a data value of the first driving signal and a data value of the second driving signal.

In an embodiment, any one of the first driving signal and the second driving signal has a data value of a high level during a first period included in the driving cycle. When generating the individual signal, the individual signal is generated to have a data value of the high level during a second period smaller than the first period.

According to an embodiment of the present disclosure, an electronic device includes a processor configured to provide input image data to a display device, and the display device configured to display an image, based on the input image data. The display device includes a display panel including a plurality of signal lines connected to at least one pixel, at least one first output pad configured to transfer a first driving signal supplied to the signal lines, at least one second output pad configured to transfer a second driving signal supplied to the signal lines, a plurality of detection pads configured to sense each of the first driving signal and the second driving signal, an individual pad disposed adjacent to the at least one first output pad and the at least one second output pad, a driving circuit configured to generate an individual signal by analyzing a waveform of each of the first driving signal and the second driving signal, and a printed circuit board disposed on the driving circuit.

BRIEF DESCRIPTION OF THE DRAWINGS

The above and other features of the present disclosure will become more apparent by describing in detail embodiments thereof with reference to the accompanying drawings.

FIG. 15 is a view illustrating embodiments of data values of the individual signal according to frequencies of the first scan driving signal and the second scan driving signal.

DETAILED DESCRIPTION

Figure 1:
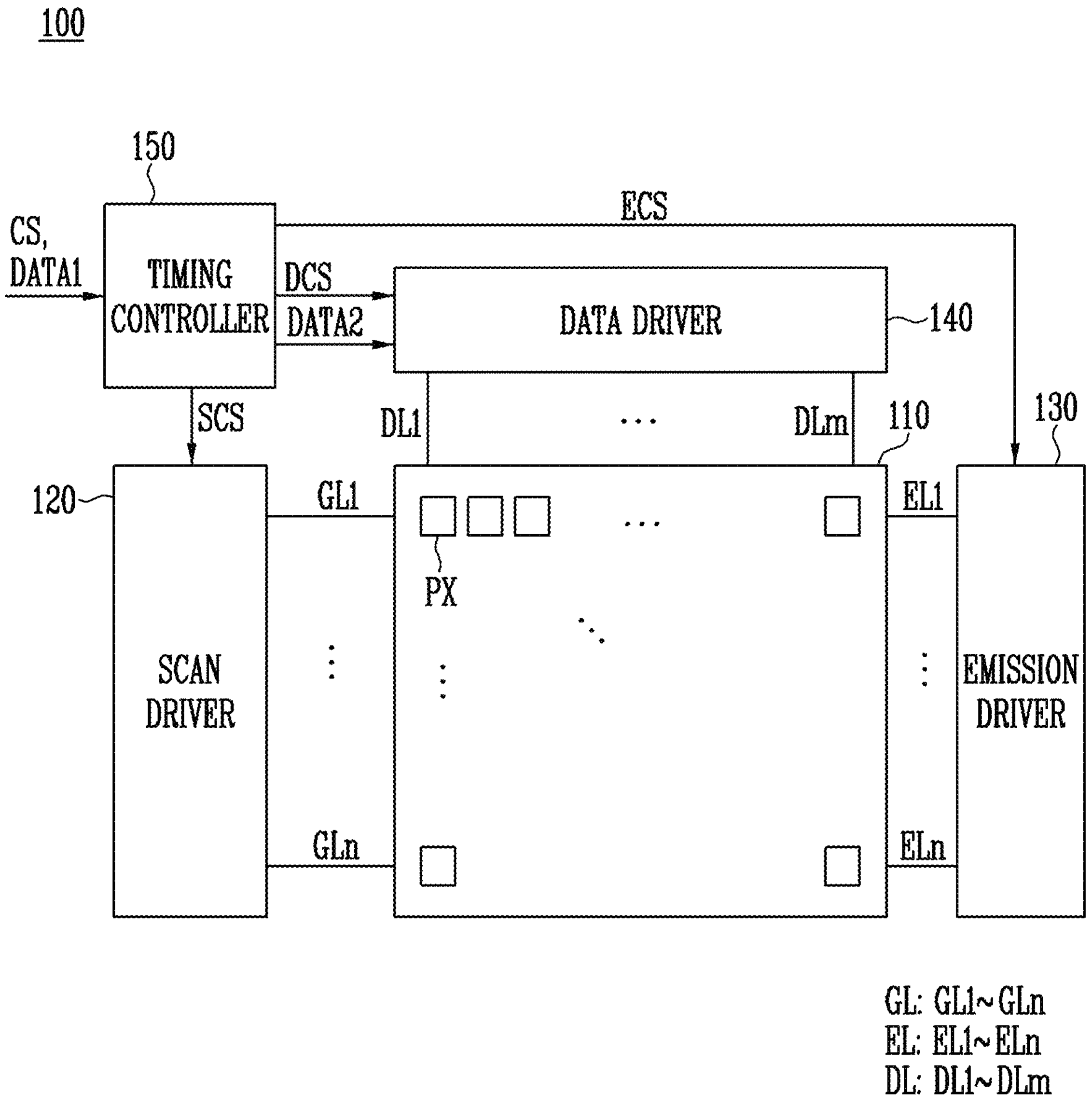
FIG. 1 is a block diagram illustrating a display device in accordance with an embodiment of the present disclosure.

Embodiments of the present disclosure will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationships between components should be interpreted in a like fashion.

It will be understood that when a component "includes" an element, unless there is another opposite description thereto, the component does not exclude another element but may further include another element. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms "first", "second," etc. may be used herein to describe various elements, these elements should not be limited by these terms. These terms are only used to distinguish one element from another element. Thus, a "first" element discussed below could also be termed a "second" element without departing from the teachings of the present disclosure.

Spatially relative terms, such as "below," "above," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

The terms "about" or "approximately" as used herein are inclusive of the stated value and means within an acceptable range of deviation for the particular value as determined by one of ordinary skill in the art, considering the measurement in question and the error associated with measurement of the particular quantity (e.g., the limitations of the measurement system). For example, "about" or "approximately" can mean within one or more standard deviations, or within ±30%, 20%, 10% or 5% of the stated value.

In a display device including a driving circuit electrically connected to a display panel of the display device through one or more pads, which provide a plurality of signals to the display panel, voltages having different magnitudes may be applied to the one or more pads. A corrosion phenomenon may occur in any one of the pads due to a potential difference generated between adjacent pads. The corrosion phenomenon occurring in pads may cause, for example, a resistance increase, a disconnection, a short circuit, a bonding failure, and the like, and result in deterioration of the reliability of driving of the display device. Embodiments of the present application, which are described in detail below, may reduce or prevent this deterioration, and thus, may increase the reliability of driving of the display device.

Embodiments of the present disclosure provide a display device that may improve reliability by preventing or reducing corrosion in the pads of a driving circuit. The display device may include a display panel with a plurality of signal lines connected to at least one pixel, along with at least one first output pad that transfers a first driving signal and at least one second output pad that transfers a second driving signal to the signal lines. A plurality of detection pads may sense both the first and second driving signals. An individual pad may be positioned adjacent to the first and second output pads. The driving circuit may generate an individual signal by analyzing the waveforms of both the first and second driving signals. Implementation of this individual signal may manage potential differences between signals applied to the pads, which may reduce the risk of corrosion and improve the overall reliability of the display device.

Figure 2:
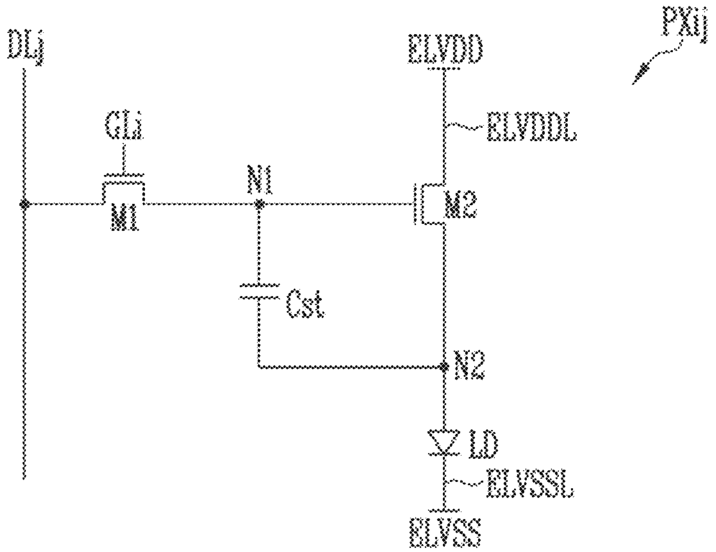
FIG. 2 is a circuit diagram illustrating an embodiment of any one of a plurality of pixels included in the display device shown in FIG. 1.

FIG. 1 is a block diagram illustrating a display device in accordance with an embodiment of the present disclosure. FIG. 2 is a circuit diagram illustrating an embodiment of any one of a plurality of pixels included in the display device shown in FIG. 1.

Referring to FIG. 1, the display device 100 may include a display panel 110, a scan driver 120, an emission driver 130, a data driver 140, and a timing controller 150.

The display panel 110 may include one or more pixels PX. The one or more pixels PX may be arranged in an orthogonal matrix form. In FIG. 1, it is illustrated that the pixel PX has a quadrangular shape. However, the present disclosure is not limited thereto. For example, according to embodiments, the shape of the pixel PX may be variously changed to have a shape such as a polygonal shape, a circular shape, and an elliptical shape.

The scan driver 120 may be configured to supply a scan signal to a plurality of scan lines GL1 to GLn (where n is an integer of 1 or more). In some embodiments, the scan driver 120 may be configured to sequentially supply the scan signal to the plurality of scan lines GL1 to GLn, but the present disclosure is not limited thereto. The scan driver 120 may receive a scan driving signal SCS, and supply the scan signal to the plurality of scan lines GL1 to GLn in synchronization with a timing. For example, in some embodiments, the scan driver 120 may receive a scan driving signal SCS and supply the scan signal to the scan lines GL1 to GLn in coordination with a specific timing sequence.

The emission driver 130 may be configured to supply an emission signal to a plurality of emission lines EL1 to Eln (where n is an integer of 1 or more). In some embodiments, the emission driver 130 may be configured to sequentially supply the emission signal to the plurality of emission lines EL1 to ELn, but the present disclosure is not limited thereto. The emission driver 130 may receive an emission driving signal ECS, and supply the emission signal to the plurality of emission lines EL1 to ELn in synchronization with a timing. For example, in some embodiments, the emission driver 130 may coordinate the supply of the emission signal to the emission lines EL1 to ELn according to a predetermined timing sequence.

The data driver 140 may be configured to supply (e.g., apply or output) a data voltage to a plurality of data lines DL1 to DLm (where m is an integer of 1 or more). The data driver 140 may receive a data driving signal DCS and second image data DATA2, and supply a data voltage corresponding to image data to the plurality of data lines DL1 to DLm in synchronization with a timing. For example, in some embodiments, the data driver 140 may coordinate the supply of the data voltage to the data lines DL1 to DLm according to a predetermined timing sequence.

The timing controller 150 may receive a control signal CS and first image data DATA1 from outside of the timing controller 150 (e.g., from a processor). The timing controller 150 may output the data driving signal DCS, the scan driving signal SCS, the emission driving signal ECS, and the second image data DATA2, based on the received control signal CS and the received first image data DATA1. For example, the timing controller 150 may convert the received first image data DATA1 into the second image data DATA2. Subsequently, the timing controller 150 may transfer the second image data DATA2 to the data driver 140.

Referring to FIG. 2, a pixel PXij may include at least one transistor, at least one capacitor, and a light emitting element. The pixel PXij shown in FIG. 2 may be identical to the pixel PX shown in FIG. 1. For example, the pixel PXij shown in FIG. 2 may be a pixel located on an ith (where i is an integer of 1 or more) pixel row and a jth (where j is an integer of 1 or more) pixel column among the pixels PX shown in FIG. 1.

Hereinafter, it is assumed that transistors M1 and M2 are implemented with an N-type transistor (e.g., an n-channel metal oxide semiconductor (NMOS) transistor). However, the present disclosure is not limited thereto. For example, in some embodiments, the transistors M1 and M2 may be implemented with a P-type transistor (e.g., a p-channel metal oxide semiconductor (PMOS) transistor) or be implemented with a combination of N-type and P-type transistors.

A gate electrode of a first transistor M1 may be connected to an ith scan line GLi. One electrode of the first transistor M1 may be connected to a first node N1. The other electrode of the first transistor M1 may be connected to a jth data line DLj. The first transistor M1 may be referred to as a switching transistor. However, the present disclosure is not limited thereto.

A gate electrode of a second transistor M2 may be connected to the first node N1. One electrode of the second transistor M2 may be connected to a first power line ELVDDL to which a first power voltage ELVDD is applied. The other electrode of the second transistor M2 may be connected to a second node N2.

One electrode of a storage capacitor Cst may be connected to the first node N1. The other electrode of the storage capacitor Cst may be connected to the second node N2.

An anode light emitting element LD may be connected to the second node N2. A cathode of the light emitting element LD may be connected to a second power line ELVSSL to which a second power voltage ELVSS is applied. The light emitting element LD may be configured as a light emitting diode. For example, the light emitting element LD may be an organic light emitting diode. However, the present disclosure is not limited thereto. For example, as described above, in some embodiments, the light emitting element LD may be a quantum dot light emitting diode.

Figure 3:
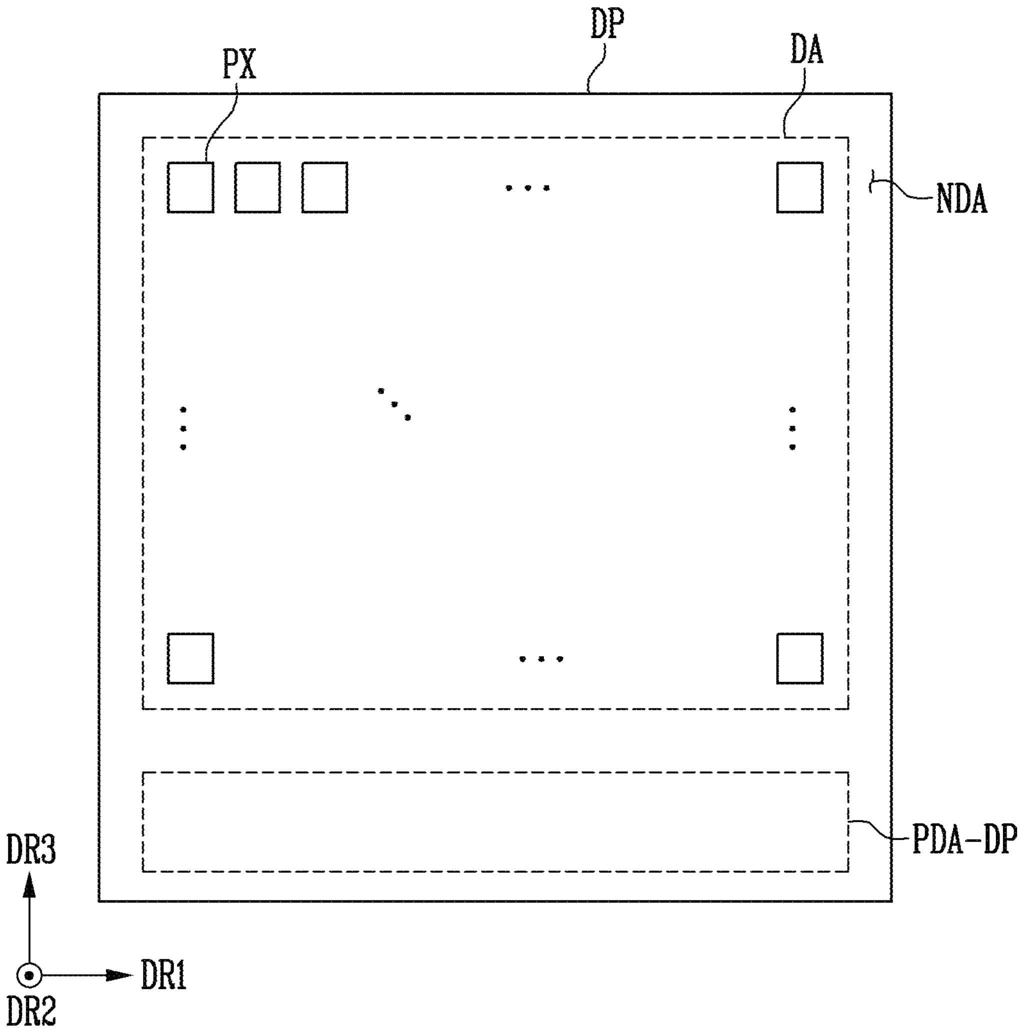
FIG. 3 is a plan view of a display panel in accordance with an embodiment of the present disclosure.
Figure 4:
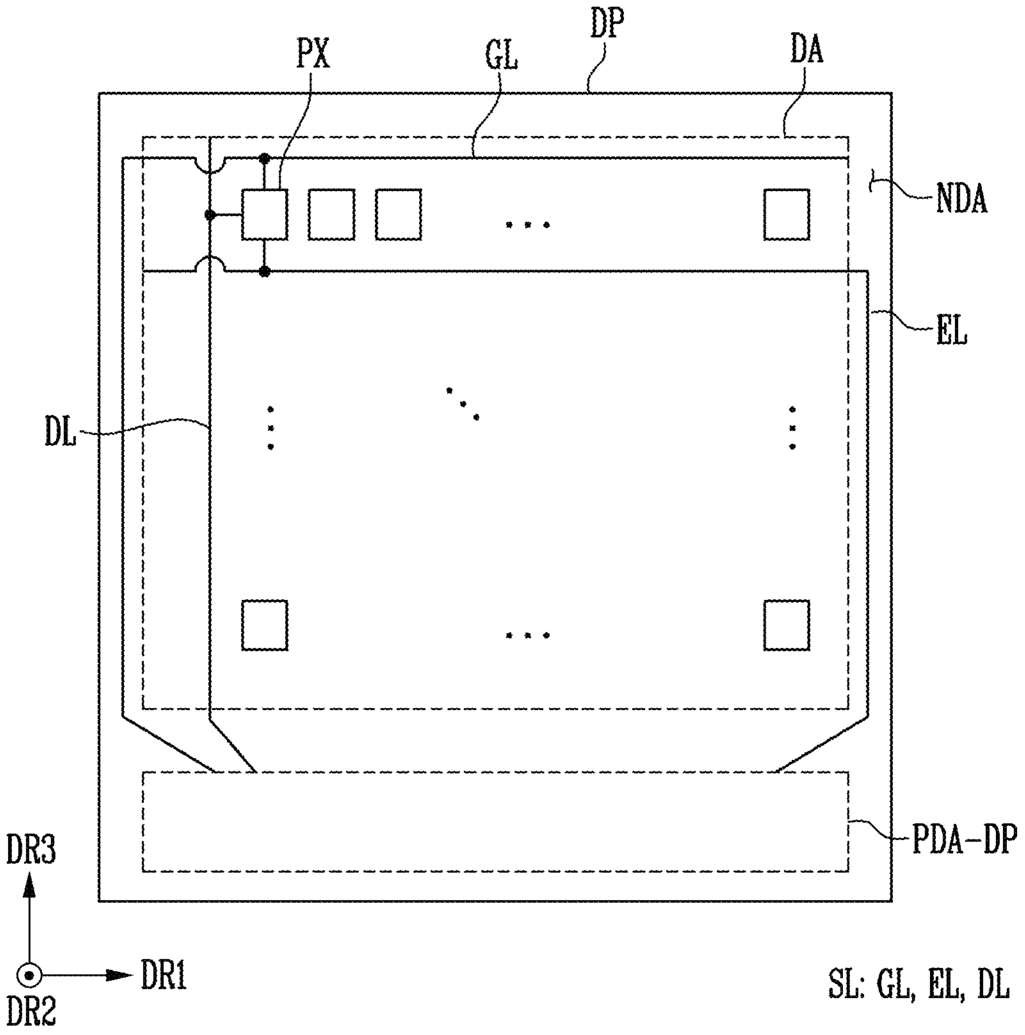
FIG. 4 is a plan view of the display panel illustrating a connection relationship between a pixel and a first pad area, which are shown in FIG. 3.
Figure 5:
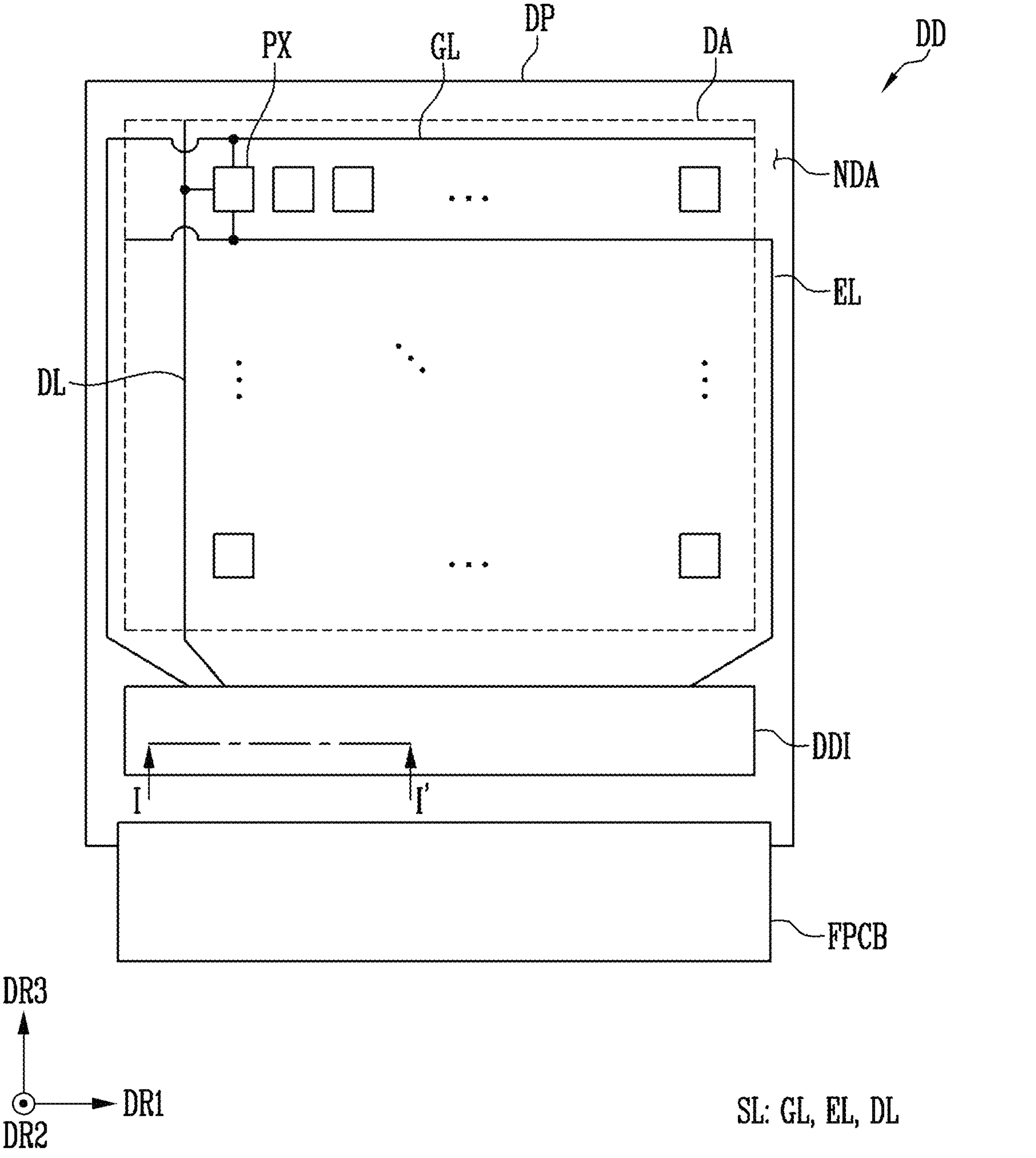
FIG. 5 is a plan view illustrating a display device in accordance with an embodiment of the present disclosure.

FIG. 3 is a plan view of a display panel in accordance with an embodiment of the present disclosure. FIG. 4 is a plan view of the display panel illustrating a connection relationship between a pixel and a first pad area, which are shown in FIG. 3. FIG. 5 is a plan view illustrating a display device in accordance with an embodiment of the present disclosure.

The display panel DP shown in FIG. 3 may be identical to the display panel 110 shown in FIG. 1. Hereinafter, for convenience of explanation, overlapping descriptions will be omitted.

Referring to FIG. 3, the display panel DP may be an emissive display panel. In some embodiments, the display panel DP may be an organic light emitting display panel or a quantum dot light emitting display panel. When the display panel DP is an organic light emitting display panel, a light emitting layer may include an organic light emitting material. When the display panel DP is a quantum dot light emitting display panel, a light emitting layer may include a quantum dot and a quantum rod. Hereinafter, for convenience of description, the display panel DP is described as being implemented as an organic light emitting display panel.

The display panel DP may include a display area DA and a non-display area NDA disposed adjacent to the display area DA. The non-display area NDA may be an area in which an image is not displayed. In an example, the display area DA may be defined as an area in which pixels PX are disposed to provide image information to users. The non-display area NDA is a peripheral area of the display area DA, and may surround the display area DA. For example, the non-display area NDA may be defined as an area in which lines and electronic components, used for driving the pixels PX, are disposed.

The non-display area NDA may include a first pad area PDA-DP. A plurality of pads may be arranged in a first direction DR1 on the first pad area PDA-DP. The display panel DP may receive an electrical signal from outside of the display panel DP through the plurality of pads.

Referring to FIG. 4, each of the pixels PX may be connected to the first pad area PDA-DP through a plurality of signal lines SL. Each of the pixels PX may be connected to any one of the signal lines SL. For example, each of the pixels PX may be connected to any one of an emission line EL, a data line DL, and a scan line GL. Accordingly, each of the pixels PX may receive a plurality of signals and/or a voltage.

Referring to FIG. 5, the display device DD may include a display panel DP, a driving circuit DDI, and a printed circuit board FPCB.

The display panel DP may include a substrate that supports the display panel DP. In some embodiments, the substrate may be a rigid substrate made of glass. The substrate may be a flexible substrate which is bendable, foldable, rollable, and the like. The substrate may include an insulating material including a polymer resin such as, for example, polyimide, and the like.

In accordance with an embodiment, the substrate may include a silicon wafer substrate formed using a semiconductor process. The substrate may include a semiconductor material suitable for forming circuit elements. For example, the semiconductor material may include silicon, germanium, and/or silicon-germanium. The substrate may be provided from, for example, a bulk wafer, an epitaxial layer, a silicon on insulator (SOI) layer, a semiconductor on insulator (SeOI) layer, or the like.

The driving circuit DDI may be disposed on the display panel DP. For example, the driving circuit DDI may be disposed on the above-described substrate. In other words, the driving circuit DDI may be disposed in a Chip-On Pad (COP) manner on the display panel DP (or the substrate). However, the present disclosure is not limited thereto. For example, in some embodiments, the driving circuit DDI may be disposed in a Chip-On Film (COF) manner or a Chip-On Glass (COG) manner on the display panel DP.

Figure 7:
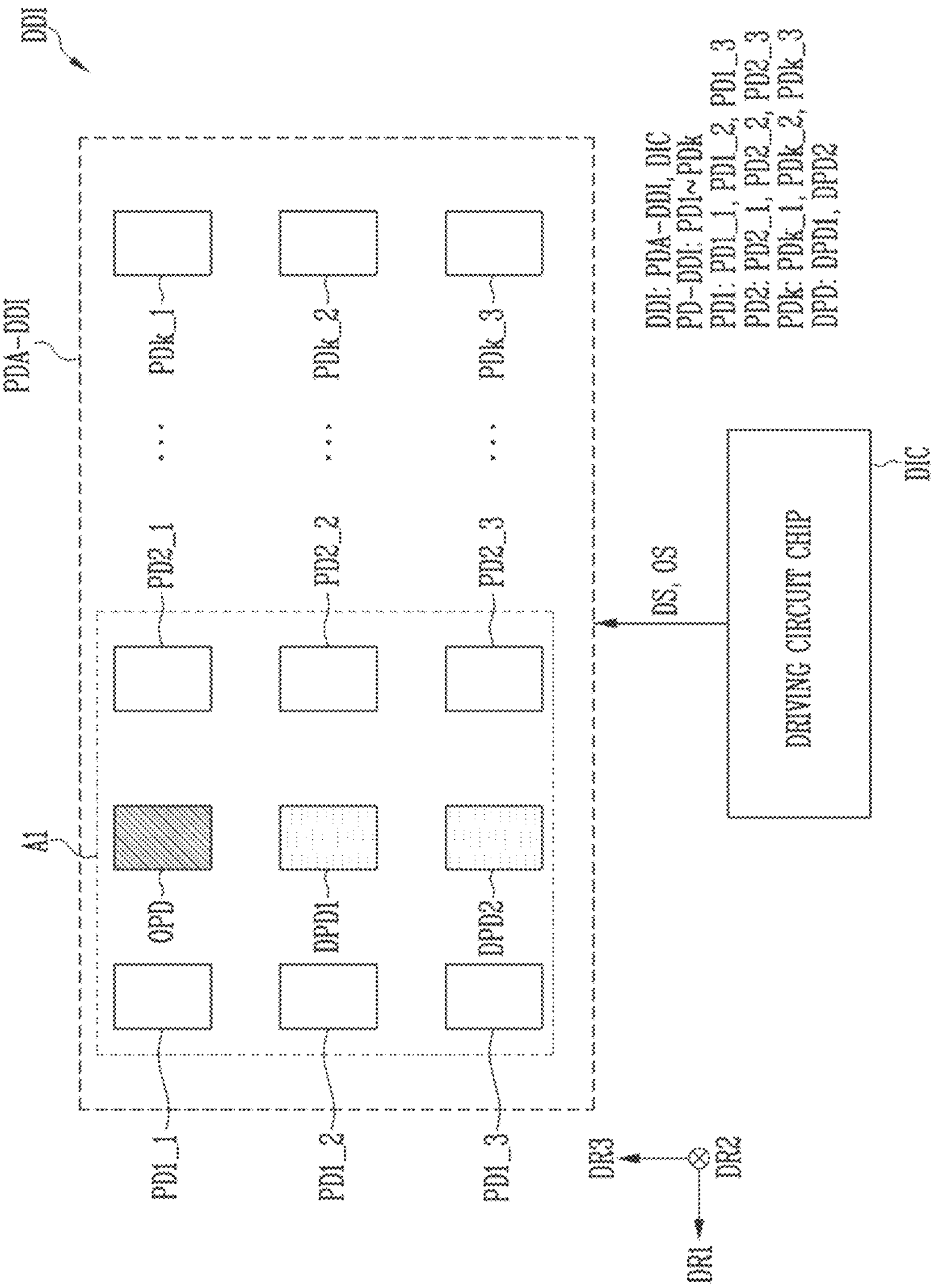
FIG. 7 is a plan view illustrating an embodiment of a driving circuit shown in FIG. 5.

The driving circuit DDI may include a second pad area PDA-DDI (see FIG. 7). For example, the driving circuit DDI may include the second pad area PDA-DDI including a plurality of pads.

The first pad area PDA-DP and the second pad area PDA-DDI may overlap each other. The pads of the first pad area PDA-DP and the second pad area PDA-DDI may be in contact with each other. Accordingly, the driving circuit DDI may be electrically connected to the display panel DP through a plurality of pads.

The driving circuit DDI may include a driving circuit chip DIC (see FIG. 7). The driving circuit chip DIC may supply a plurality of signals to the second pad area PDA-DDI. For example, the driving circuit chip DIC may provide various voltages and/or various signals. Accordingly, the driving circuit chip DIC may supply the voltages and/or the signals to the signal lines SL sequentially via the second pad area PDA-DDI and the first pad area PDA-DP.

Referring to FIGS. 1 and 5, the driving circuit DDI may include at least one of the scan driver 120 (see FIG. 1), the emission driver 130 (see FIG. 1), the data driver 140 (see FIG. 1), and the timing controller 150 (see FIG. 1). For example, two or more components among the scan driver 120, the emission driver 130, the data driver 140, and the timing controller 150 may be mounted in one integrated circuit. For example, two or more components among the scan driver 120, the emission driver 130, the data driver 140, and the timing controller 150 may be mounted in the driving circuit chip DIC. However, the present disclosure is not limited thereto.

In some embodiments, the scan driver 120 included in the driving circuit DDI may supply a scan signal to the scan line GL sequentially via the second pad area PDA-DDI and the first pad area PDA-DP. In addition, the emission driver 130 included in the driving circuit DDI may supply an emission signal to the emission line EL sequentially via the second pad area PDA-DDI and the first pad area PDA-DP. In accordance with an embodiment, the data driver 140 included in the driving circuit DDI may supply a data voltage (or data signal) to the data line DL sequentially via the second pad area PDA-DDI and the first pad area PDA-DP.

In some embodiments, the driving circuit DDI may include a power generating circuit which supplies a power source utilized to drive the display panel DP. For example, the power driving circuit may supply a predetermined power source to the scan driver 120. Accordingly, the scan driver 120 may generate the scan signal through the supplied power source. However, the present disclosure is not limited thereto. For example, in some embodiments, the display device DD may be supplied with power from a power source from outside of the display device DD.

The printed circuit board FPCB may be disposed on the driving circuit DDI. However, the present disclosure is not limited thereto. For example, in some embodiments, the printed circuit board FPCB may be disposed on the display panel DP (or the substrate of the display panel DP).

The printed circuit board FPCB may be a flexible printed circuit board. Accordingly, the printed circuit board FPCB may be bent in a second direction DR2. However, the present disclosure is not limited thereto.

The printed circuit board FPCB may transfer a signal received from outside of the display panel DP. For example, the printed circuit board FPCB may be electrically connected to the display panel DP and the driving circuit DDI to supply the received signal.

Figure 6:
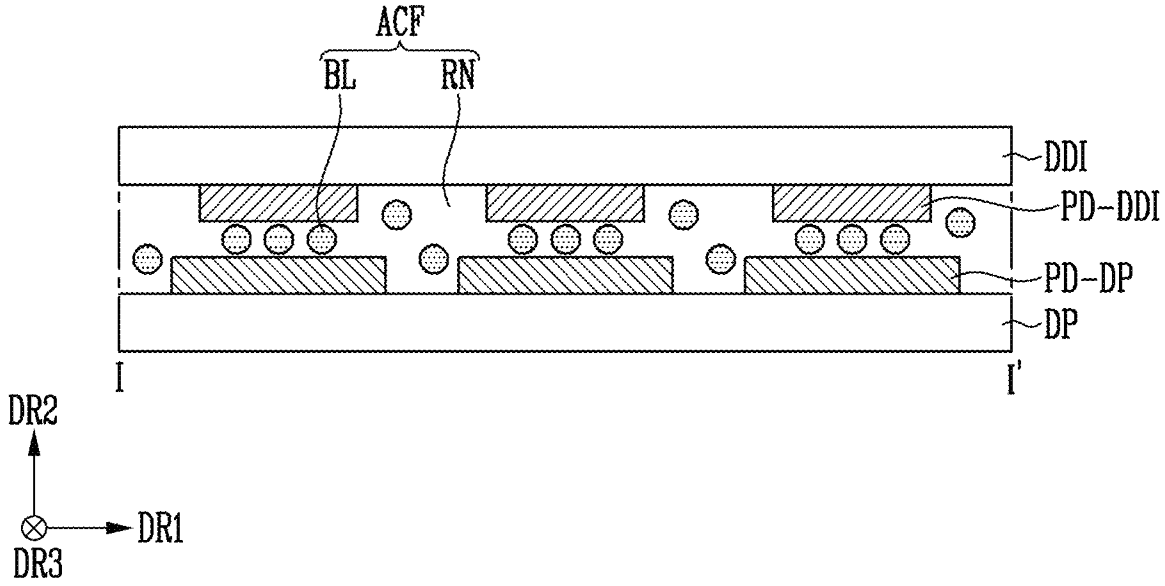
FIG. 6 is a cross-sectional view illustrating a structure of a first pad area and a second pad area, taken along line I-I' shown in FIG. 5.
Figure 8:
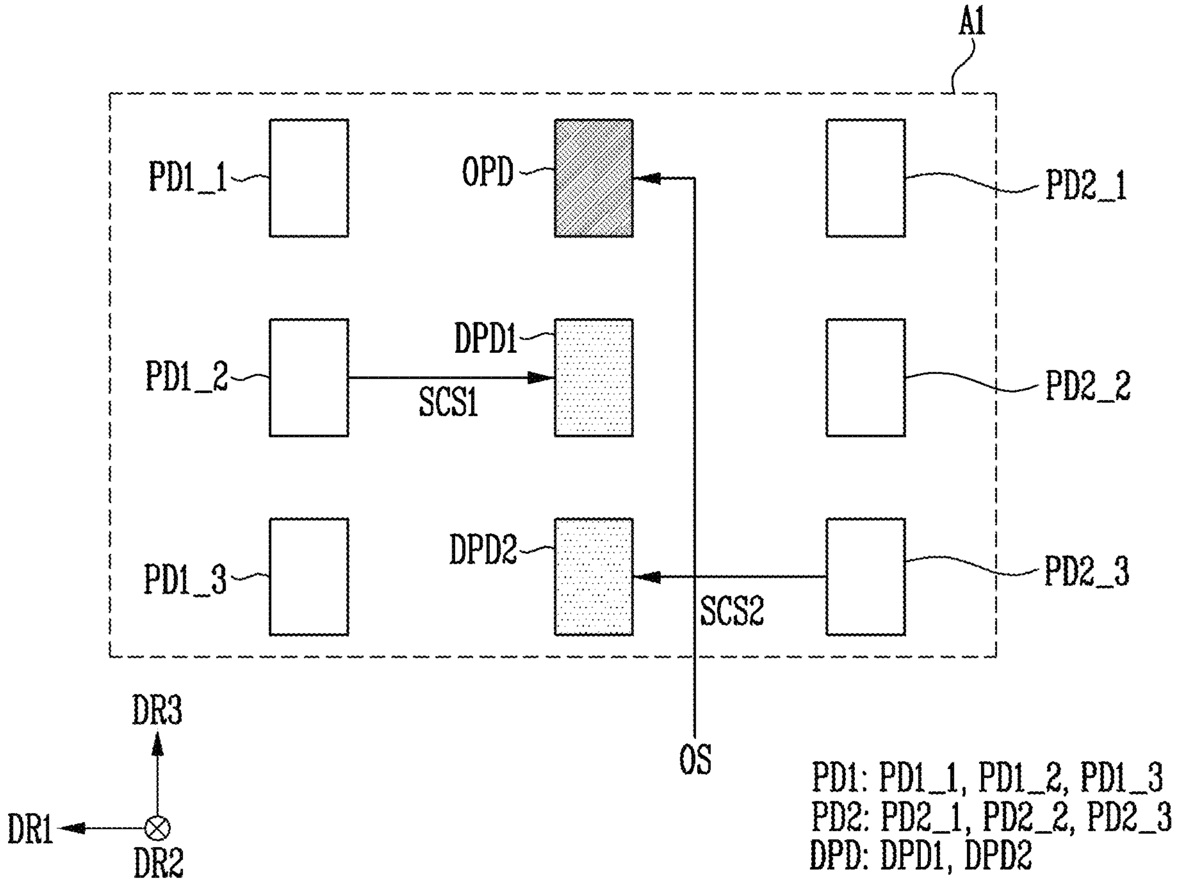
FIG. 8 is a plan view illustrating an embodiment of a first area shown in FIG. 7.

FIG. 6 is a cross-sectional view illustrating a structure of the first pad area and the second pad area, taken along line I-I' shown in FIG. 5. FIG. 7 is a plan view illustrating an embodiment of the driving circuit shown in FIG. 5. FIG. 8 is a plan view illustrating an embodiment of a first area shown in FIG. 7.

Referring to FIG. 6, input pads PD-DP may be disposed on the display panel DP. For example, the input pads PD-DP may be disposed on the substrate of the display panel DP.

In addition, output pads PD-DDI may be disposed on the driving circuit DDI. For example, the output pads PD-DDI may be disposed on a substrate of the driving circuit DDI.

A conductive adhesive film ACF may adhere the display panel DP and the driving circuit DDI to each other. For example, the conductive adhesive film ACF may be disposed between the input pads PD-DP and the output pads PD-DDI to adhere the display panel DP and the driving circuit DDI to each other. In some embodiments, the conductive adhesive film ACF may be a conductive adhesive member such as an anisotropic conductive film. However, the present disclosure is not limited thereto.

The conductive adhesive film ACF may include one or more conductive balls BL and an insulative adhesive member RN. However, the present disclosure is not limited thereto.

Each of the conductive balls BL may be a conductive particle. The conductive particle is a particle which enables electrical conduction, and may be a conductive particle such as, for example, an oxide of a metal, a particle in which a metal or an oxide of the metal is coated on a surface, using an insulative material as a nucleus, or the like. The metal included in the conductive balls BL may include, for example nickel (Ni), iron (Fe), copper (Cu), aluminum (Al), tin (Sn), zinc (Zn), chromium (Cr), cobalt (Co), silver (Ag), gold (Au), and the like. However, the present disclosure is not limited thereto.

The insulative adhesive member RN may include an insulative polymer. For example, epoxy resin, acrylic resin, and the like may be used as the insulative polymer. However, this is merely illustrative, and the insulative adhesive member RN may include another insulative polymer.

Referring to FIG. 7, the driving circuit DDI may include a second area PDA-DDI and a driving circuit chip DIC.

The second pad area PDA-DDI may be a portion of an area on a rear surface of the driving circuit DDI. For example, the second pad area PDA-DDI may be a portion of the area on the rear surface of the driving circuit DDI overlapping the first pad area PDA-DP (see FIG. 4).

The second pad area PDA-DDI may include a plurality of output pads PD-DDI. The plurality of output pads PD-DDI may include first to kth pads PD1 to PDk (where k is an integer of 1 or more) which are spaced apart from each other in the first direction DR1 and each are arranged in a third direction DR3.

Each of the first to kth pads PD1 to PDk may be configured as pads of three rows. For example, the first pads PD1 may include a (1_1) the pad PD1_1, a (1_2)th pad PD1_2, and a (1_3)th pad PD1_3, which are sequentially arranged in the opposite direction of the third direction DR3. In addition, the second pads PD2 may include a (2_1) the pad PD2_1, a (2_2)th pad PD2_2, and a (2_3)th pad PD2_3, which are sequentially arranged in the opposite direction of the third direction DR3. Further, the kth pads PDk may include a (k_1) the pad PDk_1, a (k_2)th pad PDk_2, and a (k_3)th pad PDk_3, which are sequentially arranged in the opposite direction of the third direction DR3. However, this is merely illustrative, and the present disclosure is not limited thereto.

A first area A1 may include the first pads PD1, the second pads PD2, an individual pad OPD, and detection pads DPD.

The driving circuit chip DIC may supply at least one signal and/or at least one voltage to a plurality of output pads PD-DDI disposed in the second pad area PDA-DDI. For example, the driving circuit chip DIC may supply a driving signal DS to any one of the first to kth pads PD1 to PDk disposed in the second pad area PDA-DDI. In some embodiments, the driving signal DS may include the scan driving signal SCS. However, the present disclosure is not limited thereto. For example, in some embodiments, the driving signal DS may include the emission driving signal ECS and/or the data driving signal DCS. The driving signal DS may be transferred to at least one of the signal lines SL (see FIG. 5) of the display panel DP (see FIG. 5) via the first to kth pads PD1 to PDk.

Referring to FIGS. 7 and 8, each of the first pads PD1 may be supplied with a first scan driving signal SCS1 from the driving circuit chip DIC. In addition, each of the second pads PD2 may be supplied with a second scan driving signal SCS2 from the driving circuit chip DIC. Accordingly, the driving circuit chip DIC may transfer the first scan driving signal SCS1 and the second scan driving signal SCS2 via each of the first pads PD1 and the second pads PD2. For example, the first pads PD1 and the second pads PD2 may overlap any one of the input pads PD-DP (see FIG. 6). Accordingly, the driving circuit chip DIC may transfer the first scan driving signal SCS1 to the display panel DP via the first pads PD1 and the input pads PD-DP. Also, the driving circuit chip DIC may transfer the second scan driving signal SCS2 to the display panel DP via the second pads PD2 and the input pads PD-DP.

The detection pads DPD may be disposed between the first pads PD1 and the second pads PD2. For example, a first detection pad DPD1 may be disposed between the (1_2)th pad PD1_2 and the (2_2)th pad PD2_2. In addition, a second detection pad DPD2 may be disposed between the (1_3)th pad PD1_3 and the (2_2)th pad PD2_3. However, the present disclosure is not limited thereto.

The detection pads DPD may sense the scan driving signal SCS. For example, the first detection pad DPD1 may be electrically connected to the (1_2)th pad PD1_2. Accordingly, the first detection pad DPD1 may sense the first scan driving signal SCS1 from the (1_2)th pad PD1_2. In addition, the second detection pad DPD2 may be electrically connected to the (2_3)th pad PD2_3. The second detection pad DPD2 may sense the second scan driving signal SCS2 from the (2_3)th pad PD2_3.

The individual pad OPD may be disposed between the first pads PD1 and the second pads PD2. For example, the individual pad OPD may be disposed between the (1_1)th pad PD1_1 and the (2_1)th pad PD2_1. However, the present disclosure is not limited thereto.

The individual pad OPD may be supplied with an individual signal OS. For example, the individual pad OPD may receive the individual signal OS from the driving circuit chip DIC.

Referring to FIGS. 6 to 8, when the driving circuit DDI applies the driving signal DS to the output pads PD-DDI, the plurality of conductive balls BL may be oxidized and/or reduced. In other words, when a signal having a positive voltage is applied to any one of the output pad PD-DDI, a metal (e.g., nickel (Ni)) included in the plurality of conductive balls BL may be oxidized. For example, when a potential difference between signals applied to any one of the output pads PD-DDI and another output pad PD-DDI disposed adjacent to the above-described output pad, the oxidized metal may not be reduced. Accordingly, as the metal included in the conductive ball BL is lost, the electrical resistance of the conductive ball BL or the output pad PD-DDI may increase. Therefore, the driving circuit DDI may not supply at least one of a plurality of signals to the display panel DP, and the reliability of driving of the display device DD (see FIG. 3) may be deteriorated.

In accordance with an embodiment of the present disclosure, the driving circuit chip DIC may supply, to the individual pad OPD, an individual signal OS generated by considering a waveform of the driving signal DS. For example, the individual pad OPD may be disposed between the (1_1)th pad PD1_1 and the (2_1)th pad PD2_1. An individual signal OS may be generated based on waveforms of the first scan driving signal SCS1 and the second scan driving signal SCS2, which are respectively applied to the (1_1)th pad PD1_1 and the (2_1)th pad PD2_1. Accordingly, a potential difference between signals applied to the individual pad OPD and the (1_1)th pad PD1_1 (or the (2_1)th pad PD2_1) can be relatively decreased, and the reliability of driving of the display device DD can be improved.

Figure 9:
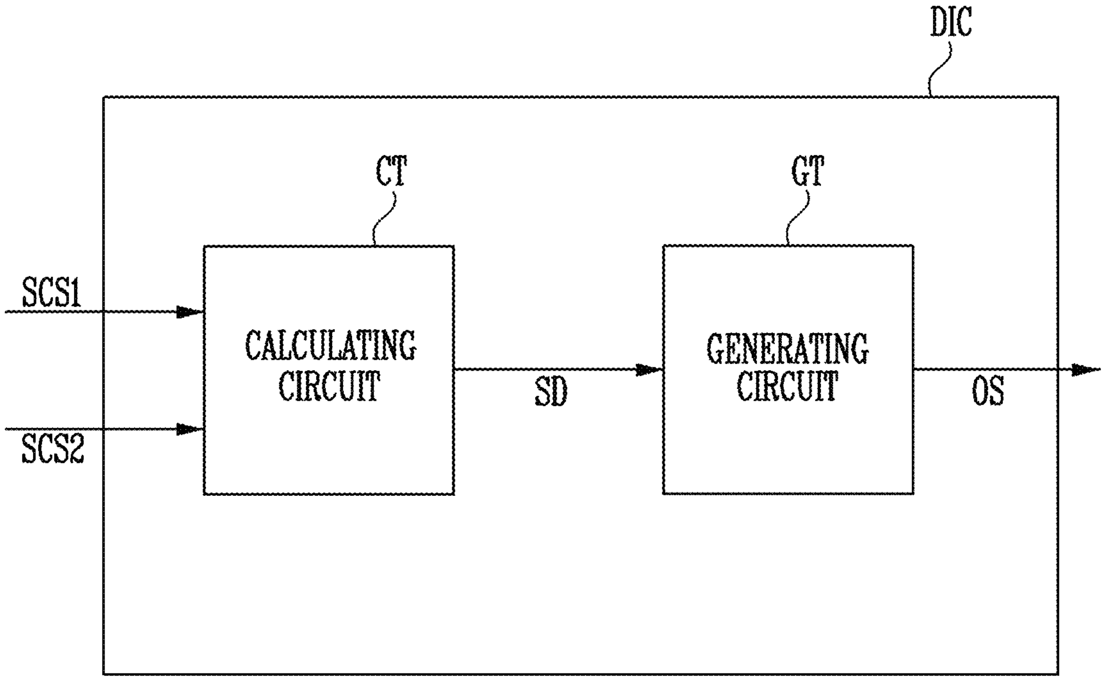
FIG. 9 is a block diagram illustrating an embodiment of a driving circuit chip shown in FIG. 7.

FIG. 9 is a block diagram illustrating an embodiment of the driving circuit chip shown in FIG. 7.

Referring to FIG. 9, the driving circuit chip DIC may include a calculating circuit CT and a generating circuit GT.

The calculating circuit CT may receive the scan driving signal SCS from the detection pads DPD. For example, the calculating circuit CT may receive the first scan driving signal SCS1 from the first detection pad DPD1 and may receive the second scan driving signal SCS2 from the second detection pad DPD2.

The calculating circuit CT may receive the first scan driving signal SCS1 and the second scan driving signal SCS2 for each of a plurality of predetermined driving cycles. For example, the calculating circuit CT may receive the first scan driving signal SCS1 and the second scan driving signal SCS2 for each frame. However, the present disclosure is not limited thereto.

The calculating circuit CT may determine a waveform of the received scan driving signal SCS. For example, the calculating circuit CT may determine a first waveform of the first scan driving signal SCS1 and may determine a second waveform of the second scan driving signal SCS2.

The calculating circuit CT may generate sensing data SD based on the waveform of the scan driving signal SCS. For example, the calculating circuit CT may generate the sensing data SD including information on the determined first waveform and the determined second waveform. Accordingly, the calculating circuit CT may transfer the sensing data SD to the generating circuit GT.

The generating circuit GT may generate an individual signal OS based on the sensing data SD. For example, the generating circuit GT may generate the individual signal OS based on the first waveform and the second waveform, which is described in further detail below.

The generating circuit GT may generate the individual signal OS for each predetermined driving cycle. For example, the generating circuit GT may generate and output the individual signal OS for each frame. However, the present disclosure is not limited thereto.

FIGS. 10 to 13 are waveform diagrams illustrating a first scan driving signal, a second scan driving signal, and an individual signal in accordance with embodiments of the present disclosure.

Referring to FIGS. 8, and 10 to 13, the first scan driving signal SCS1 may be a signal transferred to the scan line GL (see FIG. 5) via the (1_1)th pad PD1_1. In addition, the second scan driving signal SCS2 may be a signal transferred to the scan line GL via the (2_1)th pad PD2_1. The individual signal OS may be a signal transferred to the individual pad OPD.

Figure 10:
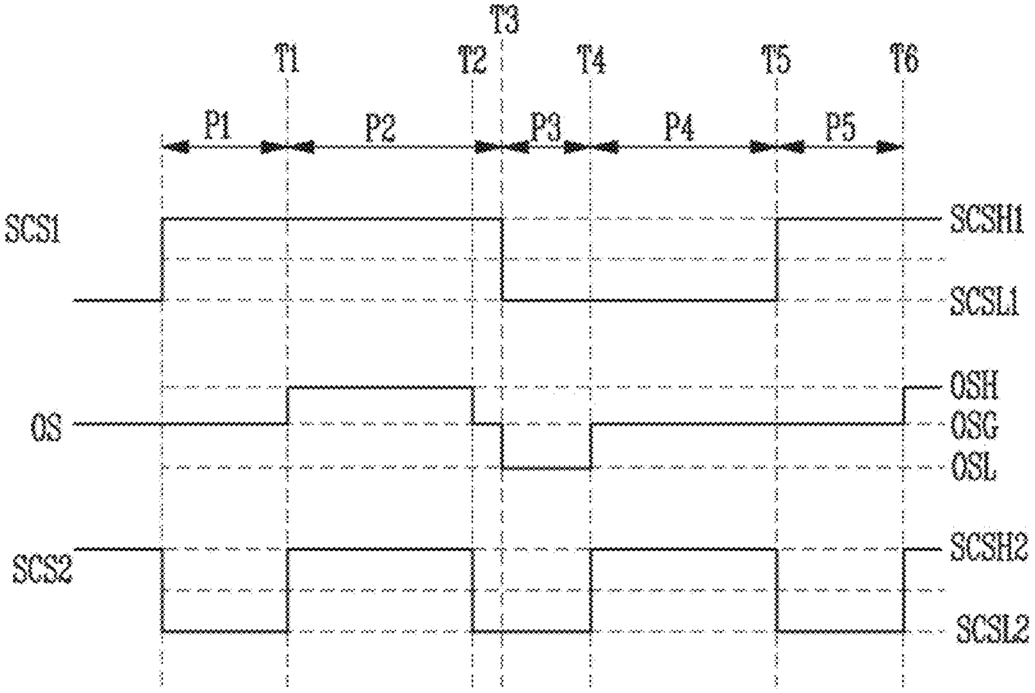
FIGS. 10 to 13 are waveform diagrams illustrating a first scan driving signal, a second scan driving signal, and an individual signal in accordance with embodiments of the present disclosure.

Referring to FIG. 10, during a first period P1, the first scan driving signal SCS1 may have a data value of a first scan high level SCSH1. During the first period P1, the second scan driving signal SCS2 may have a data value of a second scan low level SCSL2. During the first period P1, the individual signal OS may have a data value of an individual ground level OSG.

At a first time T1, the second scan driving signal SCS2 may be changed to have a data value of a second scan high level SCSH2. In addition, during a second period P2, the first scan driving signal SCS1 may have a data value of the first scan high level SCSH1. During the second period P2, the individual signal OS may have a data value of an individual high level OSH.

At a second time T2, the second scan driving signal SCS2 may be changed to have a data value of the second scan low level SCSL2. In a period between the second time T2 and a third time T3, the individual signal OS may have a data value of the individual ground level OSG.

At the third time T3, the first scan driving signal SCS1 may be changed to have a data value of a first scan low level SCSL1. Subsequently, during a third period P3, the first scan driving signal SCS1 may have a data value of the first scan low level SCSL1. During the third period P3, the individual signal OS may have a data value of an individual low level OSL.

At a fourth time T4, the second scan driving signal SCS2 may be changed to have a data value of the second scan high level SCSH2. During a fourth period P4, the individual signal OS may have a data value of the individual ground level OSG.

At a fifth time T5, the first scan driving signal SCS1 may be changed to have a data value of the first scan high level SCSH1. At the fifth time T5, the second scan driving signal SCS2 may be changed to have a data value of the second scan low level SCSL2. During a fifth period P5 including the fifth time T5, the individual signal OS may have a data value of the individual ground level OSG.

In an embodiment of the present disclosure, the generating circuit GT may generate an individual signal OS having an average value of a data value of the first scan driving signal SCS1 and a data value of the second scan driving signal SCS2.

Figure 11:
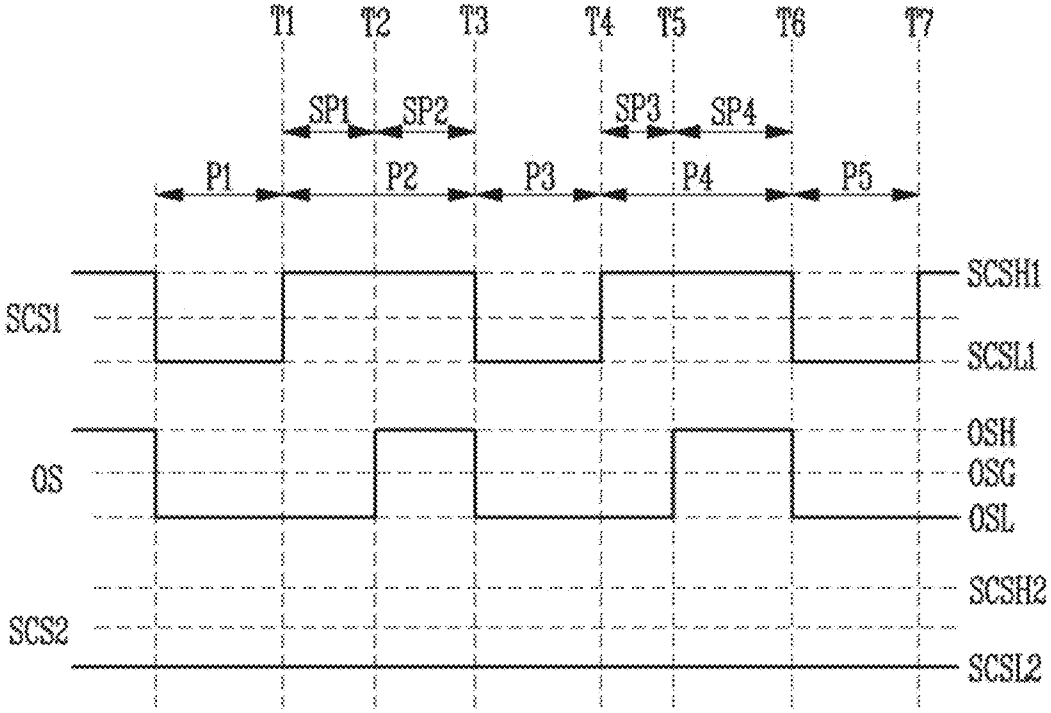
Figure 12:
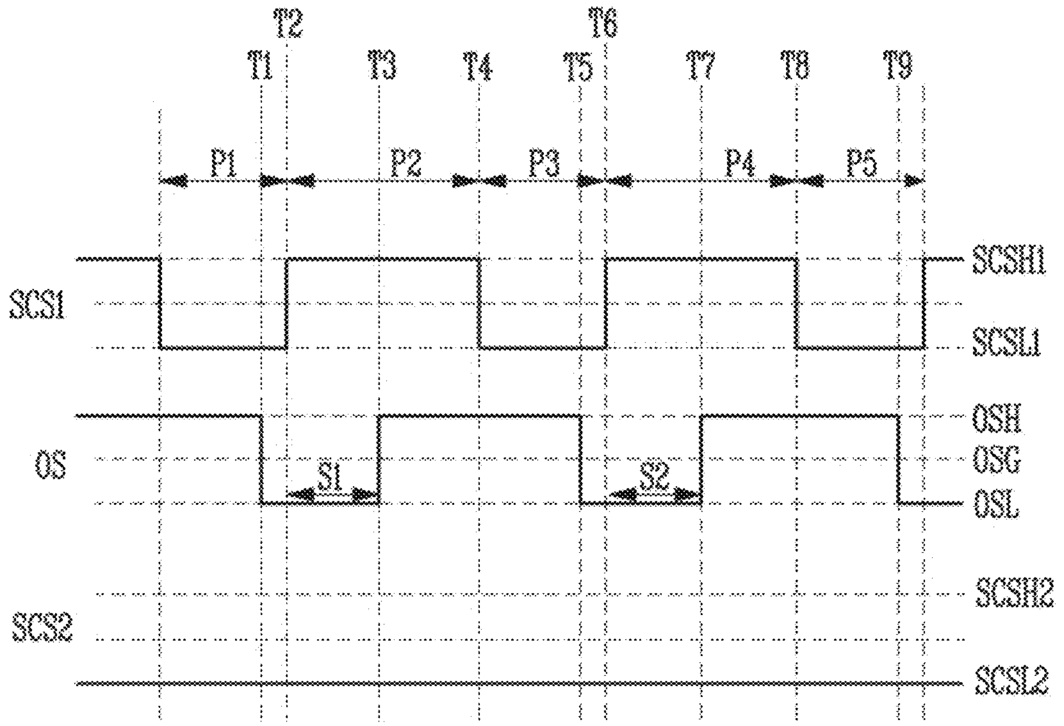
Figure 13:
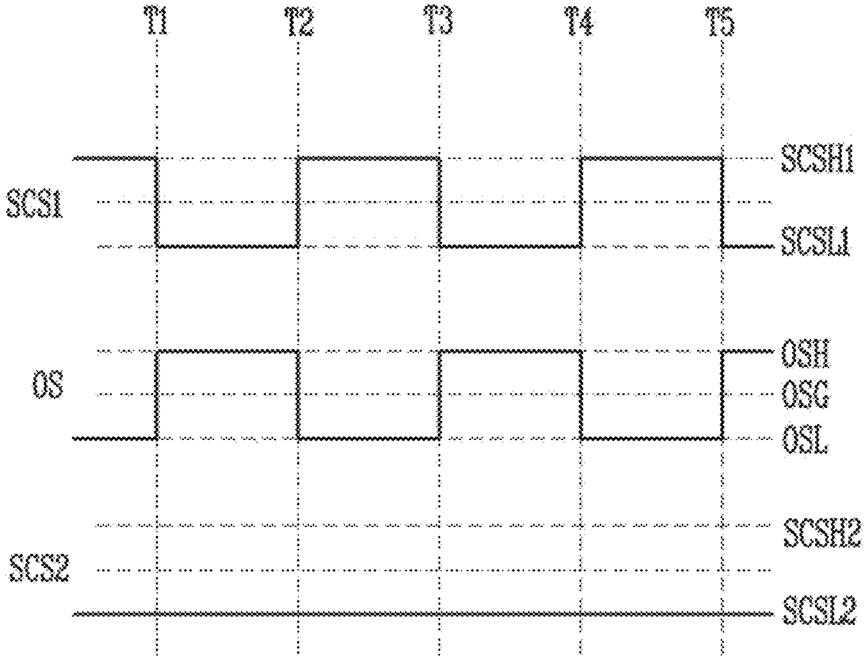

Referring to FIGS. 11 to 13, the second scan driving signal SCS2 may have a data value of the second scan low level SCSL2. For convenience of description, it is illustrated that the second scan driving signal SCS2 maintains the data value of the second scan low level SCSL2 during one frame. However, the present disclosure is not limited thereto.

Referring to FIG. 11, during a first period P1, the first scan driving signal SCS1 may have a data value of the first scan low level SCSL1. During the first period P1, the individual signal OS may have a data value of the individual low level OSL.

During a first sub-period SP1, the individual signal OS may have a data value of the individual low level OSL. Subsequently, during a second sub-period SP2, the individual signal OS may have a data value of the individual high level OSH. Accordingly, the electrical resistance of the output pads PD-DDI (see FIG. 7) can be prevented from increasing as the metal included in the conductive ball BL (see FIG. 6) is lost. For example, during the first sub-period SP1, the first scan driving signal SCS1 having a high level may be applied to the (1_1)th pad PD1_1 (see FIG. 8). Also, during the first sub-period SP1, the individual signal OS having a low level may be applied to the individual pad OPD (see FIG. 8). Accordingly, during the first sub-period SP1, the (1_1)th pad PD1_1 may have a positive voltage compared to the individual pad OPD, and the metal included in the conductive ball BL disposed adjacent to the (1_1)th pad PD1_1 may be lost. During the second sub-period SP2, the individual signal OS having the high level may be applied to the individual pad OPD. Accordingly, during the second sub-period SP2, the metal included in the conductive ball disposed adjacent to the (1_1)th pad PD1_1 may not be lost. In other words, a period in which the (1_1)th pad PD1_1 has a positive voltage relative to the individual pad OPD adjacent thereto may be relatively decreased.

For example, during a first sub-period SP1, the individual signal OS may have a data value of the individual low level OSL. Subsequently, during a second sub-period SP2, the individual signal OS may have a data value of the individual high level OSH. As a result, an increase in the electrical resistance of the output pads PD-DDI (see FIG. 7) caused by the loss of metal in the conductive ball BL (see FIG. 6) may be prevented. For example, during the first sub-period SP1, the first scan driving signal SCS1 with a high level may be applied to the (1_1)th pad PD1_1 (see FIG. 8). Also, during the first sub-period SP1, the individual signal OS with a low level may be applied to the individual pad OPD (see FIG. 8). As a result, during the first sub-period SP1, the (1_1)th pad PD1_1 may have a positive voltage relative to the individual pad OPD, and the metal in the conductive ball BL disposed adjacent to the (1_1)th pad PD1_1 may be lost. During the second sub-period SP2, when the individual signal OS with a high level is applied to the individual pad OPD, the metal in the conductive ball disposed adjacent to the (1_1)th pad PD1_1 will not be lost. In other words, the duration in which the (1_1)th pad PD1_1 has a positive voltage relative to the individual pad OPD may be relatively decreased.

In an embodiment of the present disclosure, the individual signal OS having data values of different levels may be applied to the individual pad OPD during a second period P2. Accordingly, a period in which the metal included in the conductive ball BL disposed adjacent to the output pads PD-DDI is lost can be relatively decreased, and the reliability of driving of the display device DD (see FIG. 5) can be relatively improved.

A length of the second sub-period SP2 may be smaller than a length of the second period P2. In some embodiments, the length of the second sub-period SP2 may be half of the length of the second period P2. However, the present disclosure is not limited thereto. For example, in some embodiments, the length of the second sub-period SP2 may be longer than half of the length of the second period P2.

At a third time T3, the first scan driving signal SCS1 may be changed to have a data value of the first scan low level SCSL1. During a third period P3, the first scan driving signal SCS1 may have a data value of the first scan low level SCSL1. During the third period P3, the individual signal OS may have a data value of the individual low level OSL.

At a fourth time T4, the first scan driving signal SCS1 may be changed to have a data value of the first scan high level SCSH1. During a fourth period P4, the first scan driving signal SCS1 may have a data value of the first scan high level SCSH1. During a third sub-period SP3, the individual signal OS may have a data value of the individual low level OSL. Subsequently, at a fifth time T5, the individual signal OS may be changed to have a data value of the individual high level OSH. In other words, during a fourth sub-period SP4, the individual signal OS may have a data value of the individual high level OSH. During the fourth sub-period SP4, the metal included in the conductive ball BL disposed adjacent to the (1_1)th pad PD1_1 may not be lost. Accordingly, a risk that the electrical resistance of any one (e.g., the (1_1)th pad PD1_1) of the output pads PD-DDI to which the first scan driving signal SCS1 is applied will increase can be relatively reduced.

At a sixth time T6, the first scan driving signal SCS1 may be changed to have a data value of the first scan low level SCSL1. Also, at the sixth time T6, the individual signal OS may be changed to have a data value of the individual low level OSL.

During a fifth period P5, the first scan driving signal SCS1 may have a data value of the first scan low level SCSL1. Also, during the fifth period P5, the individual signal OS may have a data value of the individual low level OSL.

Referring to FIG. 12, during a first period P1, the first scan driving signal SCS1 may have a data value of the first scan low level SCSL1. During a period prior to a first time T1 in the first period P1, the individual signal OS may have a data value of the individual high level OSH. At the first time T1, the individual signal OS may be changed to have a data value of the individual low level OSL.

At a second time T2, the first scan driving signal SCS1 may be changed to have a data value of the first scan high level SCSH1. During a second period P2, the first scan driving signal SCS1 may have a data value of the first scan high level SCSH1. During a period prior to a third time T3 in the second period P2, the individual signal OS may have a data value of the individual low level OSL. At the third time T3, the individual signal OS may be changed to have a data value of the individual high level OSH.

In accordance with an embodiment of the present disclosure, the individual signal OS may have a waveform obtained by shifting the waveform of the first scan driving signal SCS1 by a first shift period S1. For example, the third time T3 may be a time shifted by the first shift period S1 from the second time T2 at which the first scan driving signal SCS1 is changed to have the data value of the first scan high level SCSH1. At the third time T3, the individual signal OS may be changed to have a data value of the individual high level OSH. Accordingly, during a period between the third time T3 and a fourth time T4, the metal included in the conductive ball BL disposed adjacent to the (1_1)th pad PD1_1 (see FIG. 8) to which the first scan driving signal SCS1 is applied may not be lost. In other words, a period in which the (1_1)th pad PD1_1 has a positive voltage relative to the individual pad OPD (see FIG. 8) adjacent thereto may be relatively decreased. Accordingly, a period in which the metal included in the conductive ball BL disposed adjacent to the (1_1)th pad PD1_1 is lost can be relatively decreased.

At the fourth time T4, the first scan driving signal SCS1 may be changed to have a data value of the first scan low level SCSL1. During a third period P3, the first scan driving signal SCS1 may have a data value of the first scan low level SCSL1. During a period prior to a fifth time T5 in the third period P3, the individual signal OS may have a data value of the individual high level OSH. At the fifth time T5, the individual signal OS may be changed to have a data value of the individual low level OSL.

At a sixth time T6, the first scan driving signal SCS1 may be changed to have a data value of the first scan high level SCSH1. During a fourth period P4, the first scan driving signal SCS1 may have a data value of the first scan high level SCSH1. During a period prior to a seventh time T7 in the fourth period P4, the individual signal OS may have a data value of the individual low level OSL. At the seventh time T7, the individual signal OS may be changed to have a data value of the individual high level OSH.

In accordance with an embodiment of the present disclosure, the individual signal OS may have a waveform obtained by shifting the waveform of the first scan driving signal SCS1 by a second shift period S2. For example, the seventh time T7 may be a time shifted by the second shift period S2 from the sixth time T6 at which the first scan driving signal SCS1 is changed to have the data value of the first scan high level SCSH1. At the seventh time T7, the individual signal OS may be changed to have a data value of the individual high level OSH. Accordingly, a risk that the electrical resistance of the (1_1)th pad PD1_1 to which the first scan driving signal SCS1 is applied will increase can be relatively reduced.

The first shift period S1 and the second shift period S2 may substantially have the same length. However, the present disclosure is not limited thereto. For example, in some embodiments, the first shift period S1 may be a period relatively longer than the second shift period S2.

At an eighth time T8, the first scan driving signal SCS1 may be changed to have a data value of the first scan low level SCSL1. During a fifth period P5, the first scan driving signal SCS1 may have a data value of the first scan low level SCSL1. During a period prior to a ninth time T9 in the fifth period P5, the individual signal OS may have a data value of the individual high level OSH. At the ninth time T9, the individual signal OS may be changed to have a data value of the individual low level OSL. During a period prior to the ninth time T9 in the fifth period P5, the individual signal OS may have a data value of the individual low level OSL.

Referring to FIG. 13, at a first time T1, the first scan driving signal SCS1 may be changed to have a data value of the first scan low level SCSL1. During a period between the first time T1 and a second time T2, the first scan driving signal SCS1 may have a data value of the first scan low level SCSL1.

At the first time T1, the individual signal OS may be changed to have a data value of the individual high level OSH. During the period between the first time T1 and the second time T2, the individual signal OS may have a data value of the individual high level OSH.

At the second time, the first scan driving signal SCS1 may be changed to have a data value of the first scan high level SCSH1. During a period between the second time T2 and a third time T3, the first scan driving signal SCS1 may have a data value of the first scan high level SCSH1.

At the second time T2, the individual signal OS may be changed to have a data value of the individual low level OSL. During the period between the second time T2 and the third time T3, the individual signal OS may have a data value of the individual low level OSL.

At the third time T3, the first scan driving signal SCS1 may be changed to have a data value of the first scan low level SCSL1. During a period between the third time T3 and a fourth time T4, the first scan driving signal SCS1 may have a data value of the first scan low level SCSL1.

At the third time T3, the individual signal OS may be changed to have a data value of the individual high level OSH. During the period between the third time T3 and the fourth time T4, the individual signal OS may have a data value of the individual high level OSH.

At the fourth time T4, the first scan driving signal SCS1 may be changed to have a data value of the first scan high level SCSH1. During a period between the fourth time T4 and a fifth time T5, the first scan driving signal SCS1 may have a data value of the first scan high level SCSH1.

At the fourth time T4, the individual signal OS may be changed to have a data value of the individual low level OSL. During the period between the fourth time T4 and the fifth time T5, the individual signal OS may have a data value of the individual low level OSL.

In accordance with an embodiment of the present disclosure, the waveform of the individual signal OS may have a form in which the waveform of the first scan driving signal SCS1 is reversed in a vertical direction (e.g., a y-axis direction). For example, at the first time T1, the individual signal OS may be changed to have a data value of the individual high level OSH, which corresponds to the first scan driving signal SCS1 being changed to have a data value of the first scan low level SCSL1. During the period between the first time T1 and the second time T2, the (1_1)th pad PD1_1 may function as an output pad PD-DDI (see FIG. 8) with a relatively negative voltage compared to the individual pad OPD (see FIG. 8). Accordingly, during the period between the first time T1 and the second time T2, the metal included in the conductive ball BL (see FIG. 6) disposed adjacent to the (1_1)th pad PD1_1 (see FIG. 8) may not be oxidized. Thus, the risk that the electrical resistance of the (1_1)th pad PD1_1 to which the first scan driving signal SCS1 is applied will increase can be relatively reduced.

Figure 14:
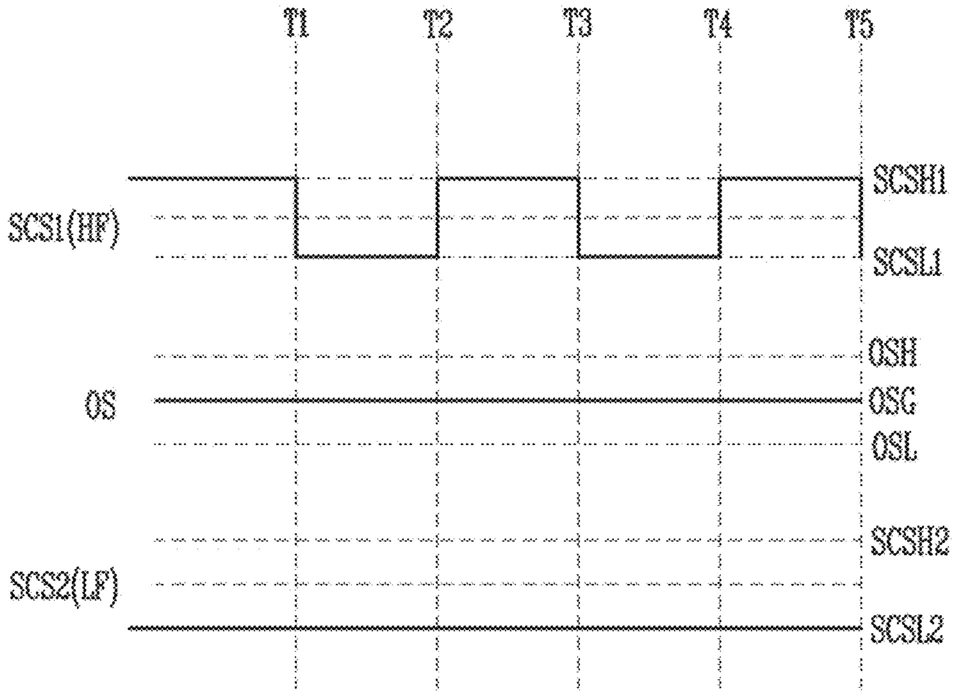
FIG. 14 is a waveform diagram illustrating a first scan driving signal, a second scan driving signal, and an individual signal in accordance with an embodiment of the present disclosure.

FIG. 14 is a waveform diagram illustrating a first scan driving signal, a second scan driving signal, and an individual signal in accordance with an embodiment of the present disclosure. FIG. 15 is a view illustrating embodiments of data values of the individual signal according to frequencies of the first scan driving signal and the second scan driving signal.

Referring to FIG. 14, at a first time T1, the first scan driving signal SCS1 may be changed to have a data value of the first scan low level SCSL1. Subsequently, during a period between the first time T1 and a second time T2, the first scan driving signal SCS1 may have a data value of the first scan low level SCSL1.

At the second time T2, the first scan driving signal SCS1 may be changed to have a data value of the first scan high level SCSH1. Subsequently, during a period between the second time T2 and a third time T3, the first scan driving signal SCS1 may have a data value of the first scan high level SCSH1.

At the third time T3, the first scan driving signal SCS1 may be changed to have a data value of the first scan low level SCSL1. Subsequently, during a period between the third time T3 and a fourth time T4, the first scan driving signal SCS1 may have a data value of the first scan low level SCSL1.

At the fourth time T4, the first scan driving signal SCS1 may be changed to have a data value of the first scan high level SCSH1. Subsequently, during a period between the fourth time T4 and a fifth time T5, the first scan driving signal SCS1 may have a data value of the first scan high level SCSH1.

During a period between the first time T1 and the fifth time T5, the second scan driving signal SCS2 may have a data value of the second scan low level SCSL2. In other words, a frequency of the second scan driving signal SCS2 may be relatively low as compared with the first scan driving signal SCS1. For example, a driving cycle of the first scan driving signal SCS1 may correspond to the period between the first time T1 and the second time T2. On the other hand, a driving cycle of the second scan driving signal SCS2 may correspond to the period between the first time T1 and the fifth time T5. Therefore, the first scan driving signal SCS1 may be a signal having a high frequency HF as compared with the second scan driving signal SCS2. In addition, the second scan driving signal SCS2 may be a signal having a low frequency LF as compared with the first scan driving signal SCS1. The individual signal OS may have a data value of the individual ground level OSG during the period between the first time T1 and the fifth time T5. However, the present disclosure is not limited thereto.

Referring to FIGS. 14 and 15, the first scan driving signal SCS1 may be a signal having a high frequency HF, and the second scan driving signal SCS2 may also be a signal having a high frequency HF. The individual signal OS may have a data value of the individual high level OSH.

In accordance with an embodiment, the first scan driving signal SCS1 may be a signal having a high frequency HF, and a second scan driving signal SCS2 may be a signal having a low frequency HL. The individual signal OS may have a data value of the individual ground level OSG.

In accordance with an embodiment, the first scan driving signal SCS1 may be a signal having a low frequency LF, and the second scan driving signal SCS2 may be a signal having a high frequency HF. The individual signal OS may have a data value of the individual ground level OSG.

In accordance with an embodiment, the first scan driving signal SCS1 may be a signal having a low frequency LF, and the second scan driving signal SCS2 may be a signal having a low frequency LF. The individual signal OS may have a data value of the individual low level OSL.

In other words, the individual signal OS applied to the individual pad OPD (see FIG. 8) may vary according to the frequencies of the first scan driving signal SCS1 and the second scan driving signal SCS2.

Figure 16:
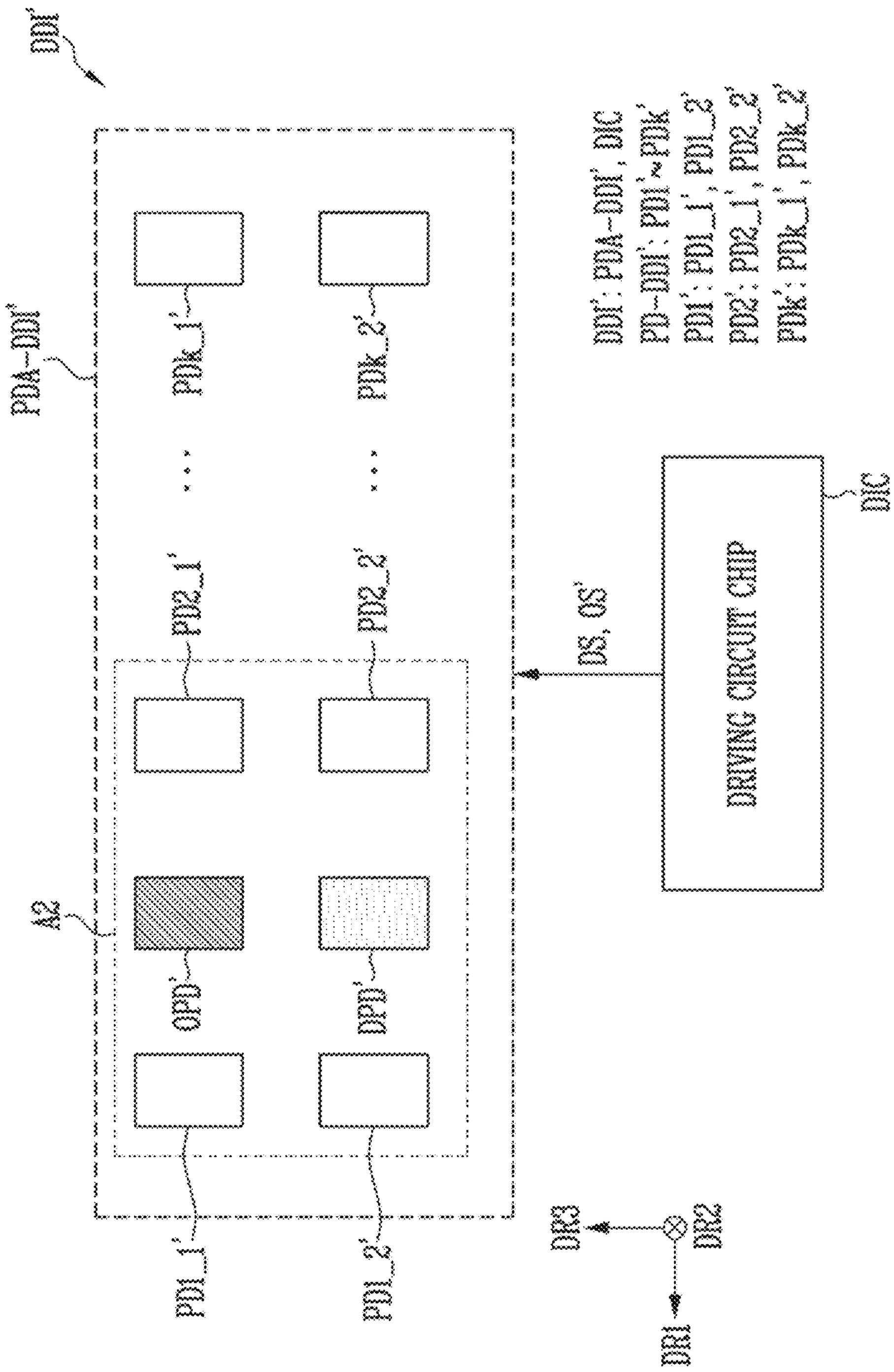
FIG. 16 is a plan view illustrating an embodiment of the driving circuit shown in FIG. 5.
Figure 17:
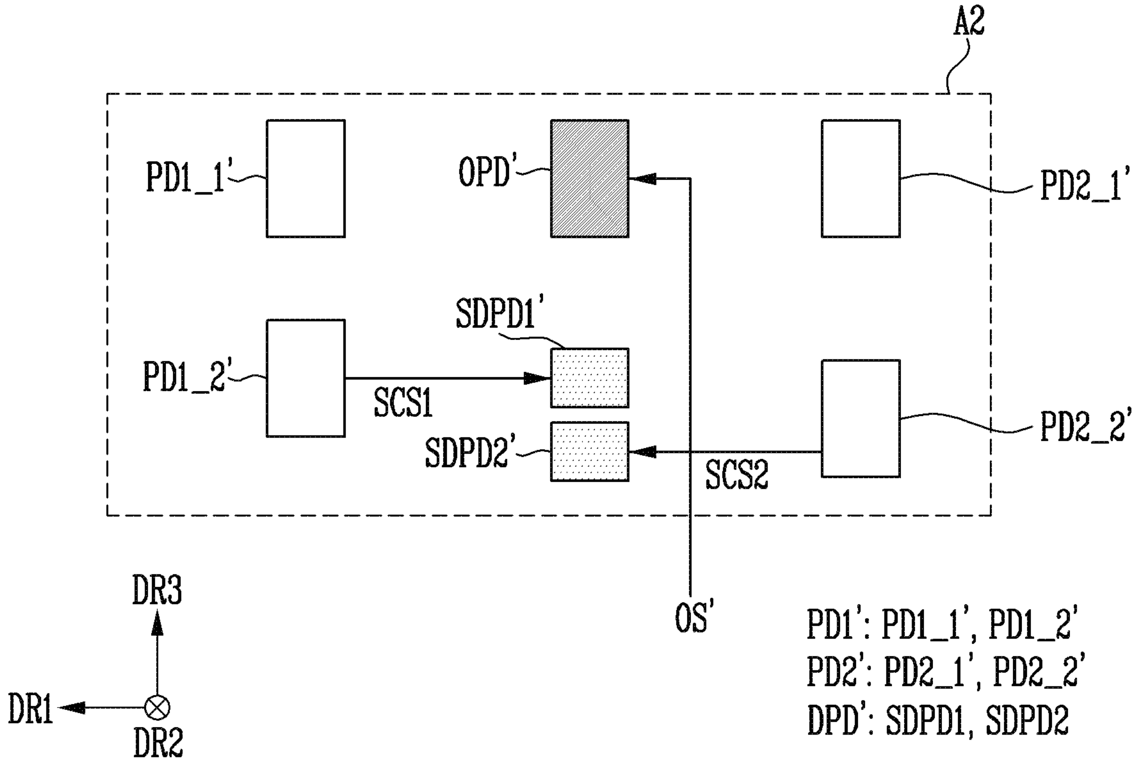
FIG. 17 is a plan view illustrating an embodiment of a second area shown in FIG. 16.

FIG. 16 is a plan view illustrating an embodiment of the driving circuit shown in FIG. 5. FIG. 17 is a plan view illustrating an embodiment of a second area shown in FIG. 16.

Referring to FIG. 16, a driving circuit DDI' may include a second pad area PDA-DDI' and a driving chip DIC.

The second pad area PDA-DDI' may be a portion of an area on a rear surface of the driving circuit DDI'. For example, the second pad area PDA-DDI' may be a portion of the area on the rear surface of the driving circuit DDI' overlapping the first pad area PDA-DP (see FIG. 4).

The second pad area PDA-DDI' may include a plurality of output pads PD-DDI'. The plurality of output pads PD-DDI' may include first to kth pads PD1' to PDk' (where k is an integer of 1 or more) which are spaced apart from each other in the first direction DR1 and arranged in the third direction DR3.

Each of the first to kth pads PD1' to PDk' may be configured as pads of two rows. For example, the first pads PD1' may include a (1_1) the pad PD1_1' and a (1_2)th pad PD1_2', which are sequentially arranged in the opposite direction of the third direction DR3. In addition, the second pads PD2' may include a (2_1) the pad PD2_1' and a (2_2)th pad PD2_2', which are sequentially arranged in the opposite direction of the third direction DR3. Further, the kth pads PDk' may include a (k_1) the pad PDk_1' and a (k_2)th pad PDk_2', which are sequentially arranged in the opposite direction of the third direction DR3.

A second area A2 may include the first pads PD1', the second pads PD2', an individual pad OPD', and a detection pad DPD'.

The driving circuit chip DIC may supply at least one signal and/or at least one voltage to a plurality of output pads PD-DDI' disposed in the second pad area PDA-DDI'. The driving circuit chip DIC shown in FIG. 16 may be described identically to the driving circuit chip shown in FIG. 7. Hereinafter, for convenience of explanation, overlapping descriptions will be omitted or simplified.

In addition, the (1_1)th pad PD1_1', the (1_2)th pad PD1_2', the (2_1)th pad PD2_1', the (2_2)th pad PD2_2', the (k_1)th pad PDk_1', the (k_2)th pad PDk_2', and the individual pad OPD', which are shown in FIG. 16, may be described identically to the (1_1)th pad PD1_1, the (1_2)th pad PD1_2, the (2_1)th pad PD2_1, the (2_2)th pad PD2_2, the (k_1)th pad PDk_1, the (k_2)th pad PDk_2, and the individual pad OPD, which are shown in FIG. 7. Hereinafter, for convenience of explanation, overlapping descriptions will be omitted.

Referring to FIGS. 16 and 17, the detection pad DPD' may include a first sub-detection pad SDPD1' and a second sub-detection pad SDPD2'.

The first sub-detection pad SDPD1' and the second sub-detection pad SDPD2' may have an area on a plane, which is smaller than an area of any one of the first pads PD1' or the second pads PD2'. For example, an area obtained by adding an area of the first sub-detection pad SDPD1' and an area of the second sub-detection pad SDPD2' may be smaller than an area of the (1_1)th pad PD1_1'. However, the present disclosure is not limited thereto.

The first sub-detection pad SDPD1' may be disposed adjacent to the (1_2)th pad PD1_2'. In addition, the second sub-detection pad SDPD2 may be disposed adjacent to the (2_2)th pad PD2_2'.

The detection pad DPD' may sense the driving signal SCS. For example, the first sub-detection pad SDPD1' may be electrically connected to the (1_2)th pad PD1_2'. Accordingly, the first sub-detection pad SDPD1' may sense a first scan driving signal SCS1 from the (1_2)th pad PD1_2'. In addition, the second sub-detection pad SDPD2' may be electrically connected to the (2_2)th pad DP2_2'. The second sub-detection pad SDPD2' may sense a second scan driving signal SCS2 from the (2_2)th pad DP2_2'.

Referring to FIGS. 16 and 17, the driving circuit chip DIC may supply an individual signal OS' to the individual pad OPD'. For example, the driving circuit chip DIC may generate the individual signal OS', based on the first scan driving signal SCS1 and the second scan driving signal SCS2, which are respectively transferred from the first sub-detection pad SDPD1' and the second sub-detection pad SDPD2'. Accordingly, the driving circuit chip DIC may transfer the individual signal OS' to the individual pad OPD'.

Figure 18:
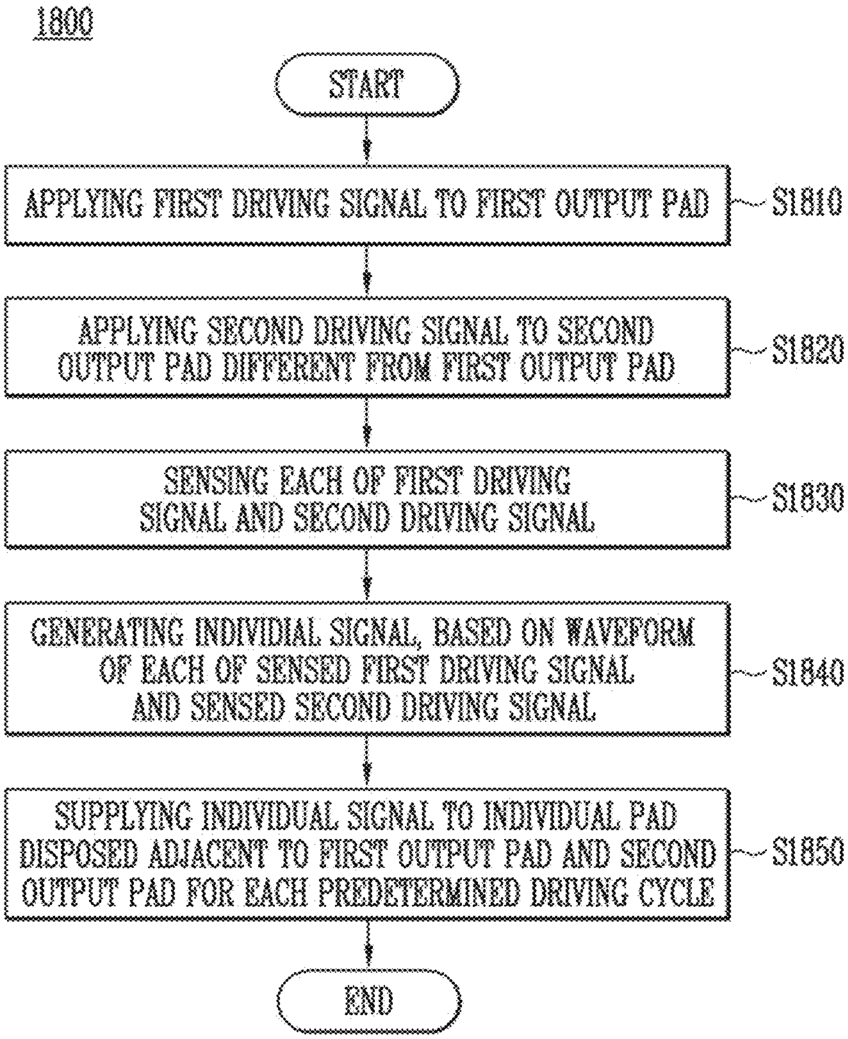
FIG. 18 is a flowchart illustrating a method of driving a display device in accordance with an embodiment of the present disclosure.

FIG. 18 is a flowchart illustrating a method of driving a display device in accordance with an embodiment of the present disclosure.

Referring to FIG. 18, the method 1800 of driving the display device in accordance with an embodiment of the present disclosure may include operation S1810 of applying a first driving signal to a first output pad, operation S1820 of applying a second driving signal to a second output pad different from the first output pad, operation S1830 of sensing each of the first driving signal and the second driving signal, operation S1840 of generating an individual signal, based on a waveform of each of the sensed first driving signal and the sensed second driving signal, and operation S1850 of supplying the individual signal to an individual pad disposed adjacent to the first output pad and the second output pad for each predetermined driving cycle.

Referring to FIGS. 7, 8, and 18, in the operation S1810 of applying the first driving signal to the first output pad, the driving circuit chip DIC may transfer a driving signal DS to any one of the output pads PD-DDI. For example, the driving circuit chip DIC may supply a first scan driving signal SCS1 to the (1_1)th pad PD1_1.

Referring to FIGS. 7, 8, and 18, in the operation S1820 of applying the second driving signal to the second output pad different from the first output pad, the driving circuit chip DIC may transfer a different driving signal DS to another one of the output pads PD-DDI. For example, the driving circuit chip DIC may supply a second scan driving signal SCS2 to the (2_1)th pad PD2_1.

Referring to FIGS. 7 to 9 and 18, in the operation S1830 of sensing each of the first driving signal and the second driving signal, the detection pads DPD may sense the driving signal DS. For example, the first detection pad DPD1 may sense the first scan driving signal SCS1. In addition, the second detection pad DPD2 may sense the second scan driving signal SCS2. The first detection pad DPD1 and the second detection pad DPD2 may respectively sense the first scan driving signal SCS1 and the second scan driving signal SCS2 for each frame. However, the present disclosure is not limited thereto.

The calculating circuit CT may generate sensing data SD including information on a waveform of each of the first scan driving signal SCS1 and the second scan driving signal SCS2. The calculating circuit CT may transfer the sensing data SD to the generating circuit GT. In some embodiments, the calculating circuit CT may generate the sensing data SD for each frame.

Referring to FIGS. 8 to 13 and 18, in the operation S1840 of generating the individual signal, based on the waveform of each of the sensed first driving signal and the sensed second driving signal, the generating circuit GT may generate an individual signal OS, based on a first waveform of the first scan driving signal SCS1 and a second waveform of the second scan driving signal SCS2. For example, the generating circuit GT may generate the individual signal OS having an average value of a data value of the first scan driving signal SCS1 and a data value of the second scan driving signal SCS2, based on the sensing data SD. However, this is merely illustrative, and the generating circuit GT may generate individual signals OS in accordance with various embodiments as described above.

Referring to FIGS. 7, 8, and 18, in the operation S1850 of supplying the individual signal to the individual pad disposed adjacent to the first output pad and the second output pad for each predetermined driving cycle, the driving circuit chip DIC may supply the individual signal OS to the individual pad OPD for each predetermined driving cycle. For example, the driving circuit chip may supply the individual signal OS to the individual pad OPD for each frame. However, the present disclosure is not limited thereto.

Figure 19:
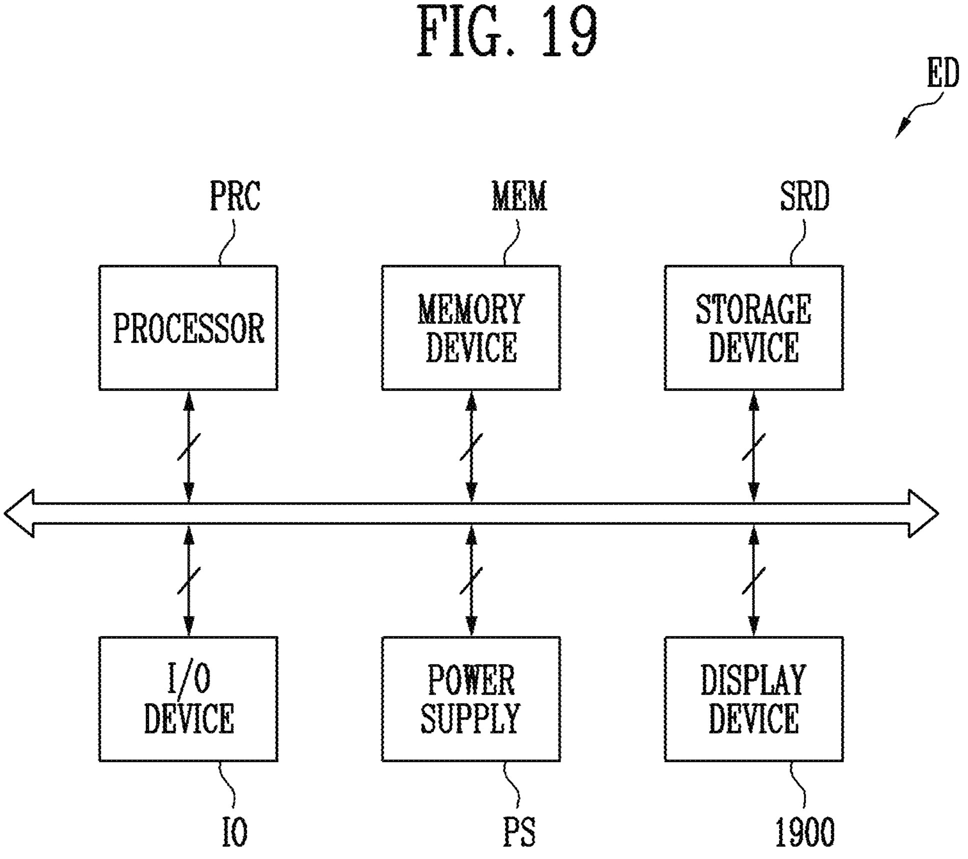
FIG. 19 is a block diagram illustrating an electronic device including a display device in accordance with embodiments of the present disclosure.
Figure 20:
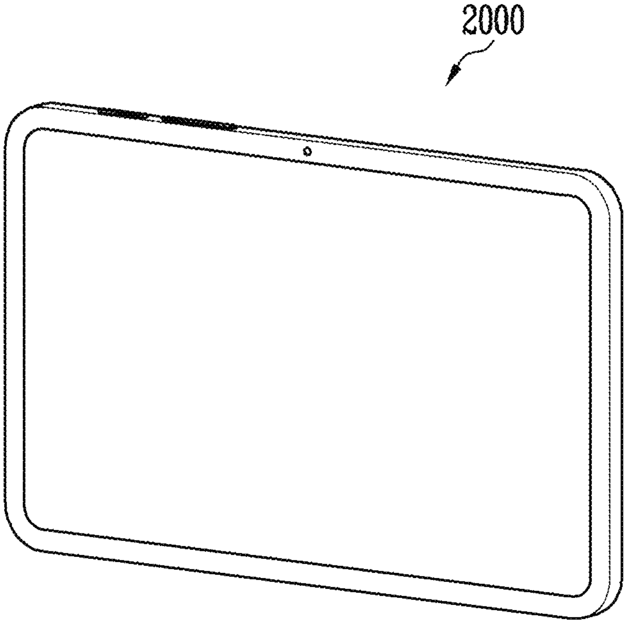
FIG. 20 is a perspective view illustrating an example in which the electronic device shown in FIG. 19 is implemented as a tablet personal computer (PC).

FIG. 19 is a block diagram illustrating an electronic device including a display device in accordance with embodiments of the present disclosure. FIG. 20 is a perspective view illustrating an example in which the electronic device shown in FIG. 19 is implemented as a tablet personal computer (PC).

Referring to FIGS. 19 and 20, the electronic device ED may include a processor PRC, a memory device MEM, a storage device SRD, an input/output (I/O) device IO, a power supply, PS, and a display device 1900. The display device 1900 may be the display device DD shown in FIG. 5. In accordance with embodiments, the electronic device ED may further include several ports capable of communicating with, for example, a video card, a sound card, a memory card, a USB device, and the like, or communicating with other systems. In an embodiment, as shown in FIG. 20, the electronic device ED may be implemented as a tablet PC 2000. However, this is merely illustrative, and the electronic device ED is not limited thereto. For example, in some embodiments, the electronic device ED may be implemented as a mobile phone, a video phone, a smart pad, a smart watch, a vehicle navigation system, a computer monitor, a notebook computer, a head mounted display device, or the like.

The processor PRC may perform specific calculations or tasks. In some embodiments, the processor PRC may be, for example, a microprocessor, a central processing unit, an application processor, or the like. The processor PRC may be connected to other components through, for example, an address bus, a control bus, a data bus, and the like. In some embodiments, the processor PRC may be connected to an extension bus such as, for example, a peripheral component interconnect (PCI) bus. The memory device MEM may store data utilized for an operation of the electronic device ED. For example, the memory device MEM may include a nonvolatile memory device such as an Erasable Programmable Read-Only Memory (EPROM) device, an Electrically Erasable Programmable Read-Only Memory (EEPROM) device, a flash memory device, a Phase Change Random Access Memory (PRAM) device, a Resistance Random Access Memory (RRAM) device, a Nano Floating Gate Memory (NFGM) device, a Polymer Random Access Memory (PoRAM) device, a Magnetic Random Access Memory (MRAM) device, a Ferroelectric Random Access Memory (FRAM) device, a volatile memory device such as a Dynamic Random Access Memory (DRAM) device, a Static Random Access Memory (SRAM) device, or a mobile DRAM device.

The storage device SRD may include, for example, a Solid State Drive (SSD), a Hard Disk Drive (HDD), a CD-ROM, and the like.

The I/O device IO may include an input device such as, for example, a keyboard, a keypad, a touch screen, or a mouse, and an output device such as, for example, a speaker or a printer. In some embodiments, the display device 1900 may be included in the I/O device IO.

The power supply PS may supply power utilized for an operation of the electronic device ED. For example, the power supply PS may be a power management integrated circuit (PMIC).

The display device 1900 may display an image corresponding to visual information of the electronic device ED. The display device 1900 may be, for example, an organic light emitting display device or a quantum dot light emitting display device, but the present disclosure is not limited thereto. The display device 1900 may be connected to other components through the buses or another communication link.

Referring to FIG. 20, the reliability of driving of the tablet PC 2000 including the display device in accordance with embodiments of the present disclosure can be improved.

In accordance with embodiments of the present disclosure, there can be provided a display device and an electronic device, which may prevent a corrosion phenomenon occurring in pads included in a driving circuit, thereby improving the driving reliability.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display device, comprising:

a display panel including a plurality of signal lines connected to at least one pixel;

at least one first output pad configured to transfer a first driving signal supplied to the signal lines;

at least one second output pad configured to transfer a second driving signal supplied to the signal lines;

a plurality of detection pads configured to sense each of the first driving signal and the second driving signal;

an individual pad disposed adjacent to the at least one first output pad and the at least one second output pad; and a driving circuit configured to generate an individual signal by analyzing a waveform of each of the first driving signal and the second driving signal.

2. The display device of claim 1, wherein the driving circuit is configured to supply the individual signal to the individual pad for each of a plurality of predetermined driving cycles.

3. The display device of claim 2, wherein the driving circuit includes:

a calculating circuit configured to analyze a first waveform of the first driving signal and a second waveform of the second driving signal; and a generating circuit configured to output the individual signal, based on each of the first waveform and the second waveform.

4. The display device of claim 3, wherein a waveform of the individual signal has a form in which any one of the first waveform and the second waveform is shifted by a predetermined time interval.

5. The display device of claim 3, wherein a waveform of the individual signal has a waveform having a form in which any one of the first waveform and the second waveform is reversed.

6. The display device of claim 2, wherein the individual signal has a data value of an average value of a data value of the first driving signal and a data value of the second driving signal.

7. The display device of claim 2, wherein any one of the first driving signal and the second driving signal has a data value of a high level during a first period, and wherein the individual signal is generated to have a data value of the high level during a second period smaller than the first period.

8. The display device of claim 7, wherein the second period is a half of the first period.

9. The display device of claim 2, wherein each predetermined driving cycle is one frame.

10. The display device of claim 1, wherein the at least one first output pad includes a (1_1)th output pad and a (1_2)th output pad, which are sequentially arranged in a first direction, wherein the at least one second output pad includes a (2_1)th output pad and a (2_2)th output pad, which are sequentially arranged in the first direction, and wherein the individual pad is disposed between the (1_1)th output pad and the (2_1)th output pad.

11. The display device of claim 10, wherein the detection pads include a first sub-detection pad and a second sub-detection pad, which are disposed between the (1_2)th output pad and the (2_2)th output pad, and wherein the first sub-detection pad senses the first driving signal, and the second sub-detection pad senses the second driving signal.

12. The display device of claim 10, wherein the at least one first output pad further includes a (1_3)th output pad spaced apart from the (1_2)th output pad in the first direction, and wherein the at least one second output pad further includes a (2_3)th output pad spaced apart from the (2_2)th output pad in the first direction.

13. The display device of claim 12, wherein the detection pads include:

a first detection pad disposed adjacent to the (1_2)th output pad or the (1_3)th output pad in a second direction intersecting the first direction; and a second detection pad disposed adjacent to the (2_2)th output pad or the (2_3)th output pad in an opposite direction of the second direction, wherein the first detection pad is configured to sense the first driving signal, and the second detection pad is configured to sense the second driving signal.

14. The display device of claim 1, wherein the driving circuit is disposed in a chip-on pad manner on the display panel.

15. A display device, comprising:

a display panel including a plurality of signal lines connected to at least one pixel;

at least one first output pad configured to transfer a first driving signal supplied to the signal lines;

at least one second output pad configured to transfer a second driving signal supplied to the signal lines;

a plurality of detection pads configured to sense each of the first driving signal and the second driving signal;

an individual pad disposed adjacent to the first output pad and the second output pad; and a driving circuit configured to generate an individual signal, based on a frequency of each of the first driving signal and the second driving signal, wherein the driving circuit is further configured to supply the individual signal to the individual pad for each of a plurality of predetermined driving cycles.

16. A method of driving a display device, the method comprising:

applying a first driving signal to a first output pad electrically connected to a display panel;

applying a second driving signal to a second output pad different from the first output pad, which is electrically connected to the display panel;

sensing each of the first driving signal and the second driving signal;

generating an individual signal, based on a waveform of each of the sensed first driving signal and the sensed second driving signal; and supplying the individual signal to an individual pad disposed adjacent to the first output pad and the second output pad for each of a plurality of predetermined driving cycles.

17. The method of claim 16, wherein generating the individual signal includes:

analyzing, by a calculating circuit, each of a first waveform of the first driving signal and a second waveform of the second driving signal; and outputting, by a generating circuit, the individual signal, based on each of the first waveform and the second waveform.

18. The method of claim 17, wherein, when generating the individual signal, the generating circuit outputs the individual signal having a data value of an average value of a data value of the first driving signal and a data value of the second driving signal.

19. The method of claim 17, wherein any one of the first driving signal and the second driving signal has a data value of a high level during a first period included in each driving cycle, and wherein, when generating the individual signal, the individual signal is generated to have a data value of the high level during a second period smaller than the first period.

20. An electronic device, comprising:

a processor configured to provide input image data to a display device; and the display device configured to display an image, based on the input image data, wherein the display device includes:

a display panel including a plurality of signal lines connected to at least one pixel;

at least one first output pad configured to transfer a first driving signal supplied to the signal lines;

at least one second output pad configured to transfer a second driving signal supplied to the signal lines;

a plurality of detection pads configured to sense each of the first driving signal and the second driving signal;

an individual pad disposed adjacent to the at least one first output pad and the at least one second output pad;

a driving circuit configured to generate an individual signal by analyzing a waveform of each of the first driving signal and the second driving signal; and a printed circuit board disposed on the driving circuit.

* * * * *